United States Patent
Hongo

(10) Patent No.: US 8,334,723 B2
(45) Date of Patent: Dec. 18, 2012

(54) DISTORTION COMPENSATION AMPLIFICATION DEVICE

(75) Inventor: Naoki Hongo, Ome (JP)

(73) Assignee: Hitachi Kokusai Electric, Inc., Tokyo (JP)

( * ) Notice: Subject to any disclaimer, the term of this patent is extended or adjusted under 35 U.S.C. 154(b) by 0 days.

(21) Appl. No.: 13/062,039

(22) PCT Filed: Aug. 24, 2009

(86) PCT No.: PCT/JP2009/004050
§ 371 (c)(1),
(2), (4) Date: Mar. 3, 2011

(87) PCT Pub. No.: WO2010/029690
PCT Pub. Date: Mar. 18, 2010

(65) Prior Publication Data
US 2011/0163806 A1  Jul. 7, 2011

(30) Foreign Application Priority Data
Sep. 9, 2008  (JP) ................................. 2008-231317

(51) Int. Cl.
*H03F 1/26* (2006.01)
(52) U.S. Cl. ...................................................... 330/149
(58) Field of Classification Search .................. 330/149; 375/296, 297; 455/114.3
See application file for complete search history.

(56) References Cited

U.S. PATENT DOCUMENTS
| | | |
|---|---|---|
| 6,288,610 B1 | 9/2001 | Miyashita |
| 7,944,295 B2 * | 5/2011 | Hongo et al. ................. 330/149 |
| 2008/0152037 A1 | 6/2008 | Kim et al. |

FOREIGN PATENT DOCUMENTS
| | | |
|---|---|---|
| JP | 11-154880 | 6/1999 |
| JP | 2004-112151 | 4/2004 |
| JP | 2005-101908 | 4/2005 |
| JP | 2006-93947 | 4/2006 |
| JP | 2007-129492 | 5/2007 |
| JP | 2007-208315 | 8/2007 |

OTHER PUBLICATIONS

International Search Report issued Dec. 15, 2009 in International (PCT) Application No. PCT/JP2009/004050.

(Continued)

*Primary Examiner* — Steven J Mottola
(74) *Attorney, Agent, or Firm* — Wenderoth Lind & Ponack, L.L.P.

(57) ABSTRACT

A distortion compensation amplification device includes a level detecting means that detects a signal level, a correspondence storage means that outputs a distortion compensation coefficient depending on the signal level, a pre-distortion executing means that gives distortion with an inverse characteristic to the signal, a filtering means that outputs a distortion component from a feedback signal output from an amplifier, and a correspondence acquiring means that updates a learning coefficient constituting a function that gives the inverse characteristic so as to reduce the distortion component. Each orthogonal function is the total sum of products of functions of the input signal and parameters. The parameter values are set to cause the orthogonal functions to be orthogonal to each other when functions are replaced for the functions of the input signal constituting the orthogonal functions.

4 Claims, 9 Drawing Sheets

OTHER PUBLICATIONS

Seiji Ohmori et al., "*An Adaptive Predistortion Method Based on Orthogonal Polynomial Expansion for Nonlinear Distortion Compensation*", The Institute of Electronics, Information and Communication Engineers, IEICE Technical Report RCS2007-34 (Jul. 2007).

Guangsheng Xu et al., "*An Adaptive Predistortion Method Based on Orthogonal Polynomial Expansion for Nonlinear Distortion Compensation, Part II*", The Institute of Electronics, Information and Communication Engineers, IEICE Technical Report RCS2007-214 (Mar. 2008).

Naoki Hongo et al., "*A Predistorter for a Power Amplifier affected by the Even-order Distortion*", 2003 IEEE.

* cited by examiner

| E[Φm*·Φn] | Φ3(With BPF) | Φ5(With BPF) | Φ7(With BPF) |
|---|---|---|---|
| Φ3*(With BPF) | 1.000000 | 0.003134 | 0.001612 |
| Φ5*(With BPF) | 0.003134 | 1.000010 | 0.003572 |
| Φ7*(With BPF) | 0.001612 | 0.003572 | 1.000015 |

| E[Φm*·Φn] | Φ3(With BPF) | Φ5(With BPF) | Φ7(With BPF) |
|---|---|---|---|
| Φ3*(Without BPF) | 1.000000 | 0.003134 | 0.001612 |
| Φ5*(Without BPF) | 0.003134 | 1.000010 | 0.003572 |
| Φ7*(Without BPF) | 0.001612 | 0.003572 | 1.000015 |

| $E[\Phi_m{}^* \cdot \Phi_n]$ | $\Phi_3$(Without BPF) | $\Phi_5$(Without BPF) | $\Phi_7$(Without BPF) |
|---|---|---|---|
| $\Phi_3{}^*$(Without BPF) | 1.000000 | 0.000000 | 0.000000 |
| $\Phi_5{}^*$(Without BPF) | 0.000000 | 1.000000 | 0.000000 |
| $\Phi_7{}^*$(Without BPF) | 0.000000 | 0.000000 | 1.000000 |

| $E[\Phi_m{}^* \cdot \Phi_n]$ | $\Phi_3$(With BPF) | $\Phi_5$(With BPF) | $\Phi_7$(With BPF) |
|---|---|---|---|
| $\Phi_3{}^*$(Without BPF) | 0.111909 | 0.099085 | 0.067748 |
| $\Phi_5{}^*$(Without BPF) | 0.099085 | 0.338799 | 0.091096 |
| $\Phi_7{}^*$(Without BPF) | 0.067748 | 0.091096 | 0.451395 |

DISTORTION COMPENSATION AMPLIFICATION DEVICE

BACKGROUND OF INVENTION

1. Technical Field

The present invention relates to a distortion compensation amplification device having a pre-distorter (PD) that compensates for non-linear distortion generated in an amplifier using a pre-distortion method, and more particularly, to a distortion compensation amplification device having a pre-distorter that causes pre-distortion learning coefficients (for example, correspondence given by a function, which is acquired therefrom, that gives an inverse characteristic of a non-linear characteristic of the amplifier) to efficiently converge.

2. Background Art

In general, input and output characteristics of a power amplification unit are linear in a region in which an input level is low, and are non-linear in a region in which the input level is greater than a predetermined level, and the output power is finally saturated. Typically, since an operation point close to a saturation point is used to enhance power efficiency of the power amplification unit, non-linear distortion is caused by the non-linearity of the amplifier. Due to this non-linear distortion, unnecessary signal components leak inside a desired signal band and outside the desired signal band (adjacent channel).

In general, when time is represented by t, an input signal of an amplifier is represented by complex number z(t), and an output signal of the amplifier is represented by complex number y(t), Expression 1 is established.

In Expression 1, Gain represents a gain of the amplifier and is a real number. Dn is an n-th-order non-linear distortion coefficient generated in the amplifier and is a complex number.

In Expression 1, the input and output characteristics of the amplifier are expanded in a power series. Gain·z(t) which is the first term in the right side is a linear component (desired wave) and the second term or terms subsequent thereto in the right side are non-linear components (unnecessary waves).

$$y(t) = \text{Gain} \cdot z(t) + D_3 |z(t)|^2 z(t) + D_5 |z(t)|^4 z(t) + D_7 |z(t)|^6 z(t) + \ldots \quad \text{Expression 1}$$

The reason that Expression 1 includes only odd-order terms such as third-order, fifth-order, seventh-order, ... is that a spectrum of odd-order distortion occurs in the vicinity of a spectrum of linear component Gain·z(t) as a frequency spectrum of the output signal of the amplifier is viewed. On the other hand, the even-order distortion appears as a difference-frequency component generated in a baseband and two or more times of a high-frequency component, and thus can be easily attenuated by a band-limiting filter (or a band-pass filter) and the like.

Particularly, since a base station is high in transmission power, the non-linear distortion is strictly prescribed in an ACLR (Adjacent Channel Leakage power Ratio), a spurious standard, a spectrum emission mask, or the like. Accordingly, it is an important problem how to reduce the non-linear distortion.

A pre-distortion method is known as a distortion compensation method of compensating for the non-linear distortion of the power amplification unit. The pre-distortion method is a method of compensating for the distortion generated in the power amplification unit by previously giving an inverse characteristic of AM-AM conversion and AM-PM conversion, which is the non-linear characteristics of the power amplification unit, to the input signal of the amplifier.

FIG. 11 shows a configuration example of an amplifier with a pre-distorter compensating for the distortion of a power amplification unit using the pre-distortion method. The input signal is also input to a controller 14 as necessary, as in the case where a waveform comparison method is used in the controller 14.

FIG. 2 shows a configuration example of a pre-distortion executing unit 13.

Processing units 1 to 7 and 11 to 14 shown in FIG. 11 are the same as shown in FIG. 1 which is referred to in an embodiment of the invention to be described later. FIG. 2 is referred to in an embodiment of the invention to be described later and is referred to here for the purpose of explanatory convenience, but is not intended to unnecessarily limit the invention.

Here, a waveform comparison method or a perturbation method using outside-band distorted power as an error function is used as an adaptive update algorithm of a distortion compensation table 12.

In the waveform comparison method, the controller 14 calculates an error signal from a feedback signal (an output signal of a power amplification unit 4 including distortion) acquired from an A/D converter 7 and an input signal (a signal input from the input side to the controller 14) and causes the details of the distortion compensation table 12 to converge using an LMS (Least Mean Square error) algorithm or the like.

The perturbation method is a method of using the outside-band power, which is obtained by performing Fourier transformation on the feedback signal, as an estimation function and selecting a coefficient with a smaller estimation function when the coefficient of the pre-distorter 1 varies, thereby causing the details of the distortion compensation table 12 to converge.

Both methods have different features. In the waveform comparison method, considerable precision is necessary to adjust a delay time or amplitude of the input signal and the output signal, thereby complicating the processes. On the other hand, the perturbation method uses only the feedback signal and thus can be embodied with relatively simple processes, but requires a long time for convergence.

First, problem 1 will be described.

The above-mentioned pre-distorter has room for improvement, in efficient convergence in pre-distortion information (for example, the details of the distortion compensation table 12), and requires higher efficiency.

In a memoryless pre-distorter as a specific example, since various orders of pre-distorter coefficients have an influence on each other, there is a problem in that much time is required for causing the pre-distortion information to adaptively converge.

Similarly, in a pre-distorter (a memory-effect pre-distorter) compensating for a memory effect, since various orders of pre-distorter coefficients have an influence on each other, there is a problem in that much time is required for causing the pre-distortion information to adaptively converge.

When both of the two pre-distorters are used, since the coefficients of the pre-distorters are independent of each other but have an influence on each other, there is also a problem in that much time is required for causing the pre-distortion information to adaptively converge.

To solve problem 1, as described in the embodiment of the invention to be described later, an effective method using a set of orthogonal polynomials including orthogonal functions as a function for giving an inverse characteristic of the non-linear characteristics of the amplifier so as to shorten the time of convergence is considered to be applied in a pre-distorter (for example, see Japanese Patent Application No. 2007-285032 filed by the present applicant).

Then, problem 2 will be described.

FIG. 12 shows a configuration example associated with an operation of a controller 101 (corresponding to the controller 14 shown in FIG. 11) according to the background art as a configurational example of the controller 101 when the waveform comparison method is used as an adaptive algorithm of a pre-distortion learning coefficient. FIG. 12 also shows an A/D converter 7 and a distortion compensation table 12.

Here, an update method when an adaptive algorithm of pre-distortion learning coefficients $A_i$ and $B_i$ is used will be described.

Functions of $\Phi_i$, $A_i$, $B_i$, and $E[\cdot]$ will be described in an embodiment to be described later.

The controller 101 in this embodiment includes a subtractor 111 and an adaptive algorithm unit 112.

The subtractor 111 calculates a difference between the input signal (non-distorted signal) to the pre-distorter and the feedback signal (distorted signal) from the amplifier (the amplifier of the power amplification unit 4 in this embodiment) as an error signal e(t), by subtracting the input signal from the A/D converter 7 from the input signal to the pre-distorter. In this embodiment, a non-linear distortion component is the error signal e(t).

The adaptive algorithm unit 112 updates the pre-distortion learning coefficients (for example, the details in the distortion compensation table 12 acquired thereby) using algorithms shown in Expression 2 and Expression 3 using the LMS algorithm on the basis of the error signal e(t) acquired by the subtractor 111.

$$Ai[t+1]=Ai[t]+\mu(E[\Phi i^*(t)e(t)]/E[|\Phi i(t)|^2])$$ Expression 2

$$Bi[t+1]=Bi[t]+\mu(E[\Phi i^*(t)e(t)]/E[|\Phi i(t)|^2])$$ Expression 3

Here, $0<\mu\leq 1$ is established and the magnitude of an error is normalized using $E[|\Phi_i(t)|^2]$ of the denominator. The error signal e(t) is expressed by Expression 4.

In Expression 4, x(t) represents the input signal to the pre-distorter and PAout represents the input signal to the controller 101, which is obtained by feeding back the output signal of the amplifier. Here, τ represents a temporal synchronization error and Gain' represents an amplitude-adjusting coefficient based on the amplification rate of the amplifier.

$$e(t)=x(t)-PAout(t-\tau)/Gain'$$ Expression 4

In this case, the adjustment of the delay time and the level (amplitude) is important. When the distortion is completely compensated for, the error is e(t)=0. However, when a delay time difference exists (τ≠0) or when Gain'*x(t)≠PAout(t), the error is e(t)≠0 and thus the distortion seems to appear.

For example, since the ratio of the desired signal power and the distorted power is 30 to 60 [dB] which is very great, this adjustment is important. When it is intended to solve this problem, there is a problem in that complicated and precise calculations are required and thus the circuit scale increases.

In this way, in the above-mentioned configuration of the pre-distorter (for example, the configuration shown in FIG. 12), the configuration for causing the pre-distortion learning coefficients (for example, the details of the distortion compensation table 12 obtained thereby) to converge using an adaptive algorithm still has room for improvement, thereby requiring higher efficiency.

To solve problem 2, a technique of reducing a circuit scale because the complicated and precise operation is not required when the waveform comparison method is used as the adaptive algorithm by using the configuration shown in FIGS. 3(a) and 3(b) which are referred to by the embodiments of the invention to be described later is considered (for example, see Japanese Patent Application No. 2007-285032 filed by the present applicant).

CITATION LIST

[PTL 1] JP-A-2004-112151
[PTL 2] JP-A-2005-101908

SUMMARY OF INVENTION

As described above, to solve problem 1, the technique of using a set of orthogonal polynomials including orthogonal functions as a function for giving the inverse characteristic of the non-linear characteristics of the amplifier in the pre-distorter so as to shorten the time of convergence is considered as described in the embodiment of the invention to be described later. To solve problem 2, a technique is considered of reducing a circuit scale because the complicated and precise operation is not required when the waveform comparison method is used as the adaptive algorithm by using the configuration shown in FIGS. 3(a) and 3(b) which are referred to in the embodiments of the invention to be described later (for example, see Japanese Patent Application No. 2007-285032 filed by the present applicant).

However, these techniques can shorten the time of convergence, but have a problem in that the effect of the set of orthogonal polynomials is not maximized, as shown in FIGS. 13 and 14. Accordingly, the method of shortening the time of convergence and reducing the hardware scale has room for improvement and thus there is a need for development of a more effective method.

The invention is contrived in consideration of these problems, and an object thereof is to provide a distortion compensation amplification device having a pre-distorter that can efficiently converge the pre-distortion learning coefficient (the details of which will be described later in the embodiment of the invention (after the [Configuration of First Embodiment])) at the time of compensating for the non-linear distortion generated in an amplifier using a pre-distortion method.

SOLUTION TO PROBLEM

To accomplish the above-mentioned object, the invention provides a distortion compensation amplification device having a pre-distorter that generates and outputs a signal with an inverse characteristic of a non-linear characteristic to an amplifier so as to compensate for distortion resulting from the non-linear characteristics of the amplifier.

That is, level detecting means detects a level of a signal input to the pre-distorter. The correspondence storage means stores a correspondence between a distortion compensation coefficient for executing pre-distortion and the level of the signal input to the pre-distorter, receives the level, which is detected by the level detecting means, of the signal input to the pre-distorter, and outputs the distortion compensation coefficient for executing the pre-distortion. The pre-distortion executing means receives the distortion compensation coefficient for executing the pre-distortion, which is output from the correspondence storage means, and the signal input to the pre-distorter, gives distortion with the inverse characteristic of the distortion, which results from the non-linear characteristics of the amplifier, to the signal input to the pre-distorter on the basis of the distortion compensation coefficient for executing the pre-distortion, and outputs the resultant signal to the amplifier. Filtering means removes a frequency component of desired-waves from a feedback signal output from the amplifier and divided by a direction coupler and outputs a distortion component. Correspondence acquiring means updates a pre-distortion learning coefficient of the function giving the inverse characteristic of the non-linear characteristic of the amplifier to the signal input to the pre-distorter so as to reduce the distortion component acquired by the filtering means, acquires the correspondence between the distortion compensation coefficient for executing the pre-distortion and the level of the signal input to the pre-distorter in accordance with the updated pre-distortion learning coefficient, and outputs the acquired correspondence to the correspondence storage means.

The function giving the inverse characteristic of the non-linear characteristic of the amplifier is expressed using a set of orthogonal polynomials. Each orthogonal function of the set of orthogonal polynomials is a total sum of products of one or more functions of the input signal, which are products of the value of the signal input to the pre-distorter and the power of the level of the signal, and parameters corresponding to each of the functions of the input signal. One or more parameters are set to cause the orthogonal functions to be orthogonal to each other when functions, which are acquired by applying a filter with the same filter characteristic as that of the filtering means to the functions of the input signal, are replaced for the functions of the input signal of the orthogonal functions.

Therefore, the pre-distortion learning coefficient of the set of orthogonal polynomials is updated and the correspondence between the distortion compensation coefficient for executing the pre-distortion and the level of the signal input to the pre-distorter is acquired. Accordingly, it is possible to efficiently converge the pre-distortion learning coefficient (the details of which will be described later in the embodiment of the invention (after the [Configuration of First Embodiment])), for example, at the time of compensating for the non-linear distortion generated in the amplifier using a pre-distortion method, thereby shortening the time of convergence.

For example, by updating the pre-distortion learning coefficient using an algorithm of reducing the distortion component extracted from the feedback signal, it is possible to reduce the circuit scale because a complicated process (operation) is not required, compared with the waveform comparison method. By this simplification in processes, it is possible to efficiently converge the pre-distortion learning coefficient, thereby shortening the time of convergence.

In the configuration in which the filtering means extracts the distortion component from the feedback signal and it is controlled to reduce the extracted distortion component, by applying the filter with the same filter characteristic as that of the filtering means to the functions of the input signal associated with the parameters at the time of calculating the values of one or more parameters, it is possible to realize excellent orthogonalization and to efficiently converge the pre-distortion learning coefficient, thereby shortening the converge time.

The invention can be applied to various PDs that can use a set of orthogonal polynomials, such as a memoryless PD, a memory PD, and a combination of the memoryless PD and the memory PD in parallel.

Here, a variety of aspects may be employed as long as the degree (precision) of distortion compensation is effective in practical use.

For example, the level of electric power or amplitude may be used as the level of the signal.

As a control aspect of reducing (preferably, minimizing) a distortion component in the feedback signal, various aspects may be used, and for example, a perturbation method may be used.

As the pre-distortion learning coefficient of the set of orthogonal polynomials, one or more odd-order coefficients ($A_3$, $A_5$, $A_7$, . . . ) of third-order, fifth-order, seventh-order, . . . are used, for example, in the memoryless pre-distorter, and one or more even-order coefficients ($B_2$, $B_4$, $B_6$, . . . ) of second-order, fourth-order, sixth-order are used in the memory-effect pre-distorter. When both the memoryless pre-distorter and the memory-effect pre-distorter are used, both coefficients (plural coefficients in both) are used.

As the correspondence between the distortion compensation coefficient for executing the pre-distortion and the level of the signal input to the pre-distorter, for example, a correspondence (the correspondence expressed by a power series in the past) other than the correspondence given from the function that gives the inverse characteristic of the non-linear characteristic of the amplifier and expressed by the set of orthogonal polynomials may be used. This is because both coefficients (the set of orthogonal polynomials and the power series) can be transformed to each other.

For example, the same may be used as the pre-distortion learning coefficient to be updated and the distortion compensation coefficient for executing the pre-distortion, which is corresponded to the level of the signal input to the pre-distorter.

Ideally, plural pre-distortion learning coefficients of the set of orthogonal polynomials cannot affect each other and can be independently updated.

The distortion compensation coefficient for executing the pre-distortion serves to give the inverse characteristics of the non-linear characteristics of the amplifier (for example, the inverse characteristics of the AM-AM characteristic and the AM-PM characteristic, or the inverse characteristic of the memory effect, or both thereof) to the input signal.

The correspondence storage means stores, for example, the correspondence between the distortion compensation coefficient for executing the pre-distortion and the level of the signal input to the pre-distorter by the use of a table of a memory.

For example, when a component in a frequency band of the signal (desired wave) input to the amplifier is used as the frequency component of desired-waves, the signal component obtained by removing the frequency component of desired-waves from the feedback signal is, for example, a distortion component (a component of distortion generated in the amplifier) existing in a band other than the frequency band of the desired wave.

For example, a band-pass filter or a band-limiting filter may be used as the filter.

Various algorithms may be used as the algorithm of reducing the distortion component.

As the numerical expression expressed by the total sum of products of one or more functions of the input signal, each function of which is a product of the value of the signal input to the pre-distorter and the power of the level of the signal, and parameters corresponding to each of the functions of the input signal, various expressions can be used as long as they can realize a set of orthogonal polynomials. For example, a numerical expression that is set in advance by a person and that includes parameters of the respective orders (for example, third power, fifth power, seventh power, . . . , or second power, fourth power, sixth power, . . . ) of the functions of the input signal may be set on the basis of a circuit configuration.

In the distortion compensation amplification device according to the invention may have the following configuration.

That is, input-signal function value acquiring means acquires values of the functions of input signal of the orthogonal functions corresponding to the signal input to the pre-distorter. The correspondence acquiring means extracts signal components corresponding to one or more orthogonal functions from the distortion component by complex-multiplying the distortion component acquired by the filtering means by the values of the functions of the input signal of the respective orthogonal functions acquired by the input-signal function value acquiring means respectively, and updates the pre-distortion learning coefficient so as to reduce the respective extracted signal components.

Therefore, at the time of controlling the distortion component to be reduced, it is possible to extract the components corresponding to one or more orthogonal functions from the corresponding distortion components (the entire distortion component in all the orthogonal functions) and to control the respective components to be reduced, thereby enhancing the control efficiency.

Here, when the signals corresponding to the orthogonal functions are acquired, for example, it is possible to acquire the signals having passed through a filter having the same filter characteristic as that of the filtering means or to acquire the signals not having passed through the filter.

The distortion compensation amplification device according to the invention may have another configuration described below.

That is, the correspondence acquiring means updates the pre-distortion learning coefficient so as to reduce the whole of the distortion component acquired by the filtering means.

Therefore, for example, since it is not necessary to include the input-signal function value acquiring means, it is possible to simplify the device configuration of the control.

The invention may be provided as a method or a program or a recording medium.

In the method according to the invention, the respective means of the device or system perform various processes.

In the program according to the invention, the processes are performed by a computer constituting the device or system and the computer is made to serve as the means.

In the recording medium according to the invention, the program to be executed by the computer constituting the device or system can be recorded to be read by input means of the computer and the program can cause the computer to perform various processes (procedures).

[Hereinafter, the Configuration of a Pre-Distorter Based on Another Understanding Method is Described]

Configurations (1) to (4) of the pre-distorter based on another understanding method will be described below. The details described in the configurations are not intended to unnecessarily limit the details of the invention described in other parts of this specification.

(1) A pre-distorter compensating distortion generated in an amplifier may have the following configuration.

That is, first means detects a level of a signal input to the pre-distorter. Second means acquires a signal output from the amplifier as a feedback signal and acquires a signal component which is obtained by removing a frequency component of desired-waves from the acquired feedback signal by the use of third means. Fourth means uses the signal component acquired by the third means included in the second means as a distortion component, updates the pre-distortion learning coefficient (for example, $A_i$ and $B_i$ in the embodiment to be described later) expressed by a set of orthogonal polynomials so as to reduce the distortion component, and acquires a correspondence between the distortion compensation coefficient for executing the pre-distortion and the level of the signal input to the pre-distorter. Fifth means gives pre-distortion distortion to the signal input to the amplifier depending on the distortion compensation coefficient for executing the pre-distortion corresponding to the level detected by the first means on the basis of the correspondence acquired by the fourth means.

Each orthogonal function (for example, $\Phi_i$ in the embodiment to be described later) constituting the set of orthogonal polynomials are expressed as a total sum of products of one or more parameter (for example, $\phi_{ij}$ in the embodiment to be described later) and the functions of the input signal (for example, x(t) in the embodiment to be described later) corresponding to the parameters (for example, see Expression 15 in a first embodiment to be described later, Expression 35 in a second embodiment to be described later, and Expression 40 in a third embodiment to be described later). Values obtained by solving a numerical expression (for example, see Expression 30 in the first embodiment to be described later, Expression 37 in the second embodiment to be described later, and Expression 42 in the third embodiment to be described later) for applying the filter (for example, BP[ ] in the embodiment to be described later) having the same filter characteristic as that of the third means) to the functions of the input signal corresponding to the parameters are set as the values of one or more parameters.

(2) The pre-distorter may has another configuration as described below.

That is, sixth means acquires signals corresponding to the one or more orthogonal functions on the basis of the signal input to the pre-distorter.

The fourth means extracts the corresponding components of one or more orthogonal functions from the distortion component using the signal acquired by the sixth means, updates the pre-distortion learning coefficient expressed by the set of orthogonal polynomials so as to reduce the extracted components, and acquires the correspondence between the distortion compensation coefficient for executing the pre-distortion and the level of the signal input to the pre-distorter.

(3) The pre-distorter may have another configuration as described below.

That is, the fourth means updates the pre-distortion learning coefficient expressed by the set of orthogonal polynomials so as to reduce the whole of the distortion component (the entire distortion components of all the orthogonal functions) and acquires the correspondence between the distortion compensation coefficient for executing the pre-distortion and the level of the signal input to the pre-distorter.

Therefore, for example, since it is not necessary to include the sixth means, it is possible to simplify the device configuration or the control.

(4) The pre-distorter may have another configuration as described below.

That is, the fifth means includes seventh means for embodying a memoryless pre-distorter compensating for an AM-AM characteristic and an AM-PM characteristic and eighth means for embodying a memory-effect pre-distorter compensating for a memory effect.

The fourth means updates the pre-distortion learning coefficient for both the seventh means and the eighth means, which is expressed by a single set of orthogonal polynomials, and acquires the correspondence between the distortion compensation coefficient for executing the pre-distortion and the level of the signal input to the pre-distorter for each of the seventh means and the eighth means.

Therefore, when both the memoryless pre-distorter and the memory-effect pre-distorter are used, it is possible efficiently converge the pre-distortion learning coefficient in the respective pre-distorters, for example, at the time of compensating for the non-linear distortion generated in the amplifier using the pre-distortion method, thereby shortening the time of convergence.

Here, the seventh means (memoryless pre-distorter) and the eighth means (memory-effect pre-distorter) are provided individually and are arranged in parallel, for example.

For example, each of the seventh means (memoryless pre-distorter) and the eighth means (memory-effect pre-distorter) acquires or stores the correspondence between the distortion compensation coefficient for executing the pre-distortion and the level of the signal input to the pre-distorter.

The pre-distortion learning coefficient expressed by a single set of orthogonal polynomials includes both the coefficient of the memoryless pre-distorter and the coefficient of the memory-effect pre-distorter and the interactions between both pre-distorters are also considered.

[Hitherto, the configuration of a pre-distorter based on another understanding method is described]

ADVANTAGEOUS EFFECTS OF INVENTION

As described above, the distortion compensation amplification device according to the invention can cause the pre-distortion learning coefficients to efficiently converge at the time of compensating for the non-linear distortion generated in the amplifier using the pre-distortion method.

DESCRIPTION OF

Embodiments of the invention will be described with reference to the accompanying drawings.

Figure 1:
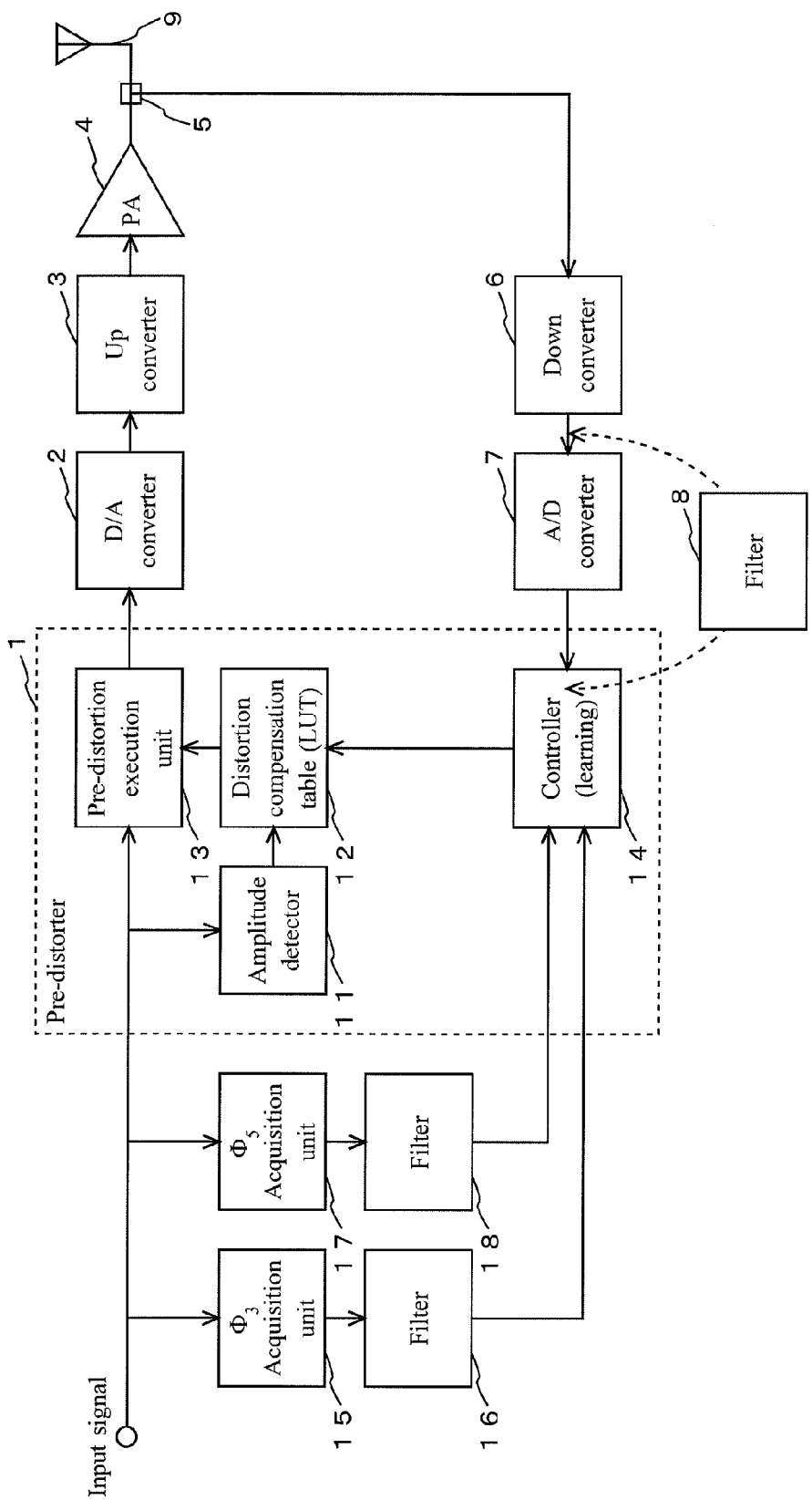
FIG. 1 is a diagram illustrating the configuration of an amplifier with a pre-distorter according to an embodiment of the invention.

FIG. 1 shows the configuration of an amplifier with a pre-distorter according to an embodiment of the invention. The amplifier with a pre-distorter is disposed, for example, in a transmitter of a base station.

The amplifier with a pre-distorter according to this embodiment includes a pre-distorter (PD) 1, a D/A (Digital to Analog) converter 2, an up converter (frequency converter) 3, a power amplification unit (PA) 4, a directional coupler 5, a down converter (frequency converter) 6, an A/D (Analog to Digital) converter 7, a feedback filter 8 including, for example, a band-pass filter (BPF), and an antenna 9.

The amplifier with a pre-distorter according to this embodiment further includes a $\Phi_3$ acquisition unit 15, a filter 16 including, for example, a band-pass filter, a $\Phi_5$ acquisition unit 17, and a filter 18 including, for example, a band-pass filter.

Here, in this embodiment, the feedback filter 8 and the input filters 16 and 18 all have the same filter characteristic and have a characteristic of removing the frequency band of an input signal (desired signal).

$\Phi_3$ and $\Phi_5$ will be described later.

The pre-distorter 1 includes an amplitude detector 11, a distortion compensation table 12 including a LUT (Look Up Table) formed in a memory, a pre-distortion execution unit 13, and a controller (learning unit) 14.

The operations of the amplifier with a pre-distorter according to this embodiment will be described.

An input signal (for example, a signal to be transmitted) to the amplifier with a pre-distorter is input to the pre-distorter 1 and is also input to the amplitude detector 11 and the pre-distortion execution unit 13. The input signal to the amplifier with a pre-distorter is also input to the $\Phi_3$ acquisition unit 15 and the $\Phi_5$ acquisition unit 17.

The amplitude detector 11 detects the value of the amplitude of the input signal and outputs the detected value to the distortion compensation table 12. The value of the amplitude is corresponded as a reference argument in the distortion compensation table 12.

The distortion compensation table 12 stores a table used to compensate for the distortion using a pre-distortion method. This table defines the inverse characteristic of the non-linear characteristic of an amplifier (an amplifier of the power amplification unit 4) of which the distortion should be compensated for, and is generally associated with the AM-AM characteristic (amplitude) and the AM-PM characteristic (phase) using the amplitude of the input signal as an indicator.

Specifically, the distortion compensation table 12 stores a correspondence between an amplitude value and a distortion compensation coefficient (control coefficient) to be supplied to the pre-distortion execution unit 13, and outputs the distortion compensation coefficient corresponded to the amplitude value input from the amplitude detector 11 to the pre-distortion execution unit 13.

The pre-distortion execution unit 13 compensates for the amplitude or phase of the input signal by giving the distortion of pre-distortion to the input signal depending on the distortion compensation coefficient (the result of referring to the distortion compensation table 12) input from the distortion compensation table 12, compensates for the amplitude or phase of the input signal, and outputs the compensated-for signal to the D/A converter 2.

The D/A converter 2 converts the signal input from the pre-distortion execution unit 13 from a digital signal into an analog signal and outputs the analog signal to the up converter 3.

The up converter 3 converts the signal input from the D/A converter 2 into a radio frequency signal by frequency conversion (up conversion) and outputs the resultant signal to the power amplification unit 4.

The power amplification unit 4 amplifies and outputs the signal input from the up converter 3. This output signal is transmitted, for example, from the antenna 9 by wireless communication.

Here, the signal amplified by the power amplification unit 4 is a signal to which the distortion with the inverse characteristic of the non-linear characteristic of the power amplification unit 4 is given in advance using the pre-distortion method. Since the distortion of pre-distortion is cancelled (is ideally completely cancelled) with the distortion generated in the power amplification unit 4, the output signal of the power amplification unit 4 is a signal of which the distortion is compensated for.

The directional coupler 5 divides a part of the signal output from the power amplification unit 4, acquires the part as a feedback signal, and outputs the feedback signal to the down converter 6.

The down converter 6 converts the feedback signal input from the directional coupler 5 into a signal of a baseband or an intermediate frequency band by the frequency conversion (down conversion) and outputs the resultant signal to the A/D converter 7.

The A/D converter 7 converts the signal input from the down converter 6 from an analog signal into a digital signal and outputs the resultant signal to the controller 14.

In this embodiment, the distortion component included in the feedback signal input to the controller 14 via the down converter 6 or the A/D converter 7 is extracted by the characteristic of the filter 8, and the signal of the distortion component is used by the controller 14. The details of the filter 8 will be described later with reference to FIGS. 3(a) and 3(b).

The $\Phi_3$ acquisition unit 15 acquires a signal of $\Phi_3$ on the basis of the input signal and outputs the acquired signal to the filter 16. Specifically, the $\Phi_3$ acquisition unit 15 acquires and outputs the signal (value) of the function $|x(t)|^2 x(t)$ of the input signal. That is, a product of the value of the signal input to the pre-distorter 1 and the power of the signal level (amplitude) is output.

The filter 16 limits the band of the signal of $\Phi_3$ input from the $\Phi_3$ acquisition unit 15 and outputs the resultant signal to the controller 14.

The $\Phi_5$ acquisition unit 17 acquires the signal of $\Phi_5$ on the basis of the input signal and outputs the acquired signal to the filter 18. Specifically, the $\Phi_5$ acquisition unit 17 acquires and outputs the signal (value) of the function $|x(t)|^4 x(t)$ of the input signal. That is, a product of the value of the signal input to the pre-distorter 1 and the power of the signal level (amplitude) is output.

The filter 18 limits the band of the signal of $\Phi_5$ input from the $\Phi_5$ acquisition unit 17 and outputs the resultant signal to the controller 14.

The controller 14 updates the details (the correspondences of the distortion compensation coefficients and the amplitude values in this embodiment) stored in the distortion compensation table 12 so as to improve the distortion compensation by the pre-distortion execution unit 13 on the basis of the signal (signal passing through the filter 8) input from the A/D converter 7 and the signals input from the filters 16 and 18. By this update, for example, it is possible to cope with the temperature variation or the temporal variation.

In this embodiment, the controller 14 extracts a component corresponding to $\Phi_3$ included in the distortion component (the entire distortion components) signal by complex-multiplying the signal corresponding to $\Phi_3$ input from the filter 16 by the fed-back distortion component signal, extracts a component corresponding to $\Phi_5$ included in the distortion component (the entire distortion components) signal by complex-multiplying the signal corresponding to $\Phi_5$ input from the filter 18 by the fed-back distortion component signal, and performs a control to reduce the distortion components corresponding to $\Phi_3$ and $\Phi_5$.

In this embodiment, the configuration in which the $\Phi_3$ and $\Phi_5$ processing units (the acquiring units 15 and 17 and the filters 16 and 18) are provided on the input side is described, but a configuration in which a processing unit of only one of $\Phi_3$ and $\Phi_5$ is provided or a configuration in which a processing unit of $\Phi_i$ of the seventh-order or higher is provided may be used. When the processing unit of $\Phi_i$ is provided, the controller 14 extracts the distortion component corresponding to the $\Phi_i$ by complex-multiplying the signal of $\Phi_i$ and by the fed-back distorted component signal, and uses the extracted distortion component for control.

Figure 2:
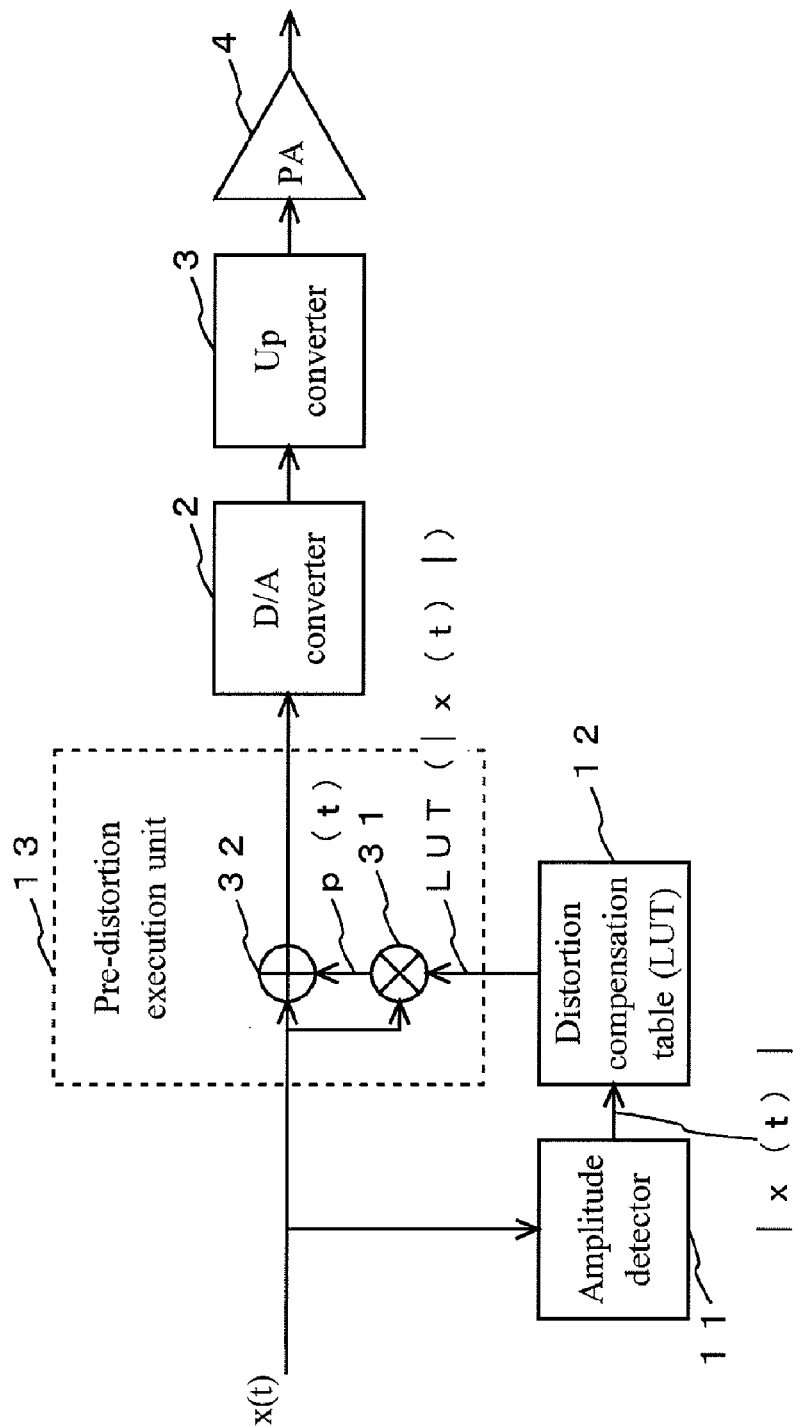
FIG. 2 is a diagram illustrating the configuration of a pre-distortion execution unit.

FIG. 2 shows the configuration of the pre-distortion execution unit 13 and also shows processing units 2 to 4, 11, and 12 in the vicinity thereof.

The pre-distortion execution unit 13 according to this example includes a complex multiplier 31 and a complex adder 32.

In the pre-distortion execution unit 13 according to this example, the input signal x(t) is input to the complex multiplier 31 and the complex adder 32.

The amplitude detector 11 detects the amplitude value |x(t)| of the input signal x(t) and the distortion compensation table 12 outputs the distortion compensation coefficient LUT (|x(t)|) corresponding to the amplitude value |x(t)| to the complex multiplier 31.

The complex multiplier 31 complex-multiplies the input signal x(t) and the distortion compensation coefficient LUT (|x(t)|) and outputs the complex-multiplication result p(t) to the complex adder 32.

The complex adder 32 complex-adds the complex-multiplication result p(t) to the input signal x(t) and outputs the complex-addition result to the D/A converter 2.

An update method when the adaptive algorithm of the pre-distortion learning coefficients $A_i$ and $B_i$ is used will be described below.

$A_i$ and $B_i$ will be described in the embodiments to be described later.

Figure 3A:
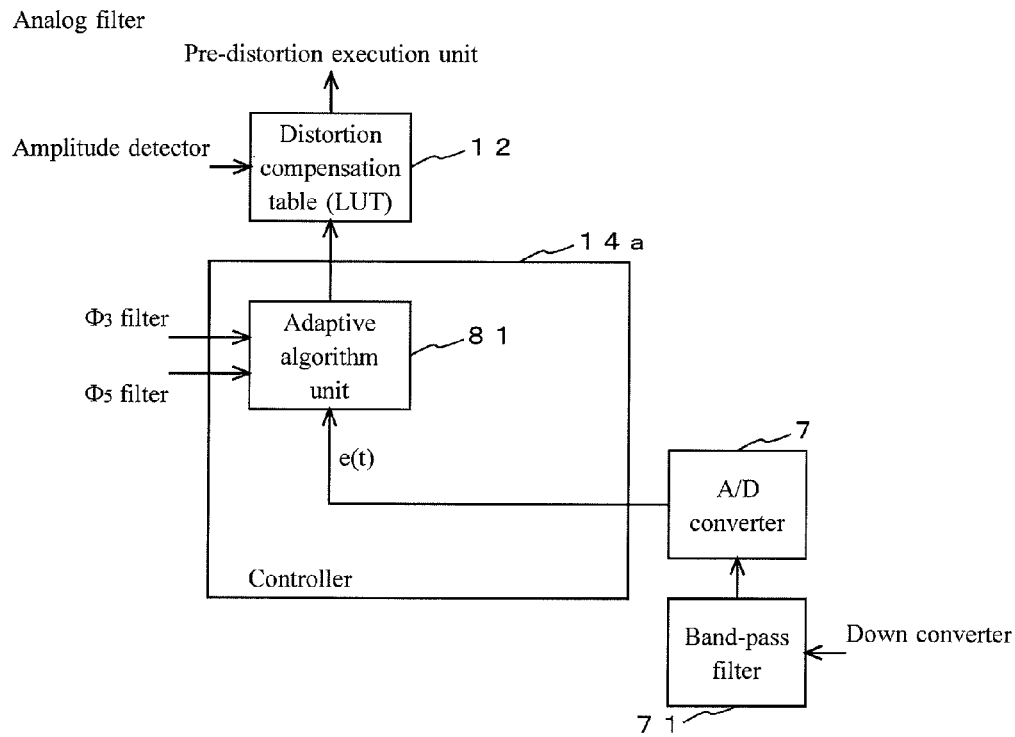
FIGS. 3(a) and 3(b) are diagrams illustrating the configuration of a controller.

FIG. 3(a) shows the operational configuration of s controller 14a (corresponding to the controller 14 shown in FIG. 1) according to an embodiment of the invention when an analog filter is used. Specifically, a band-pass filter (BPF) 71 having a characteristic of passing a signal outside a desired signal band, an A/D converter 7, a controller 14a including an adaptive algorithm unit 81, and a distortion compensation table 12 are shown.

In this configuration, the band-pass filter 71 corresponds to the filter 8 shown in FIG. 1.

In this configuration, the analog band-pass filter 71 is disposed between the down converter 6 and the A/D converter 7 (at the front stage of the A/D converter 7).

By filtering the output signal of the down converter 6 by the use of the band-pass filter 71, a signal outside the desired signal band is extracted as an error signal e(t), the extracted error signal e(t) is digitalized by the use of the A/D converter 7, the adaptive algorithm unit 81 of the controller 14a updates the pre-distortion learning coefficient (the details of which will be described later in the embodiment of the invention (after the [Configuration of First Embodiment])) for example, using an algorithm of the perturbation method on the basis of the error signal e(t) and the input signals from the filters 16 and 18.

Figure 3B:
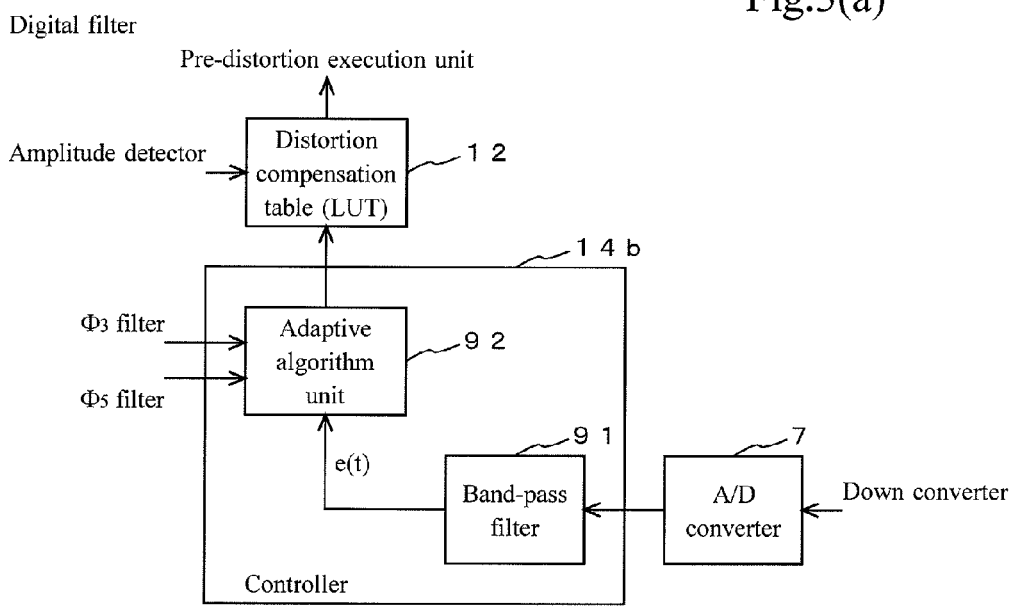

FIG. 3(b) shows the operational configuration of a controller 14b (corresponding to the controller 14 shown in FIG. 1) according to an embodiment of the invention when a digital filter is used. Specifically, an A/D converter 7, a band-pass filter 91 having a characteristic of passing a signal outside a desired signal band, a controller 14b including an adaptive algorithm unit 92, and a distortion compensation table 12 are shown.

In this configuration, the band-pass filter 91 corresponds to the filter 8 shown in FIG. 1.

In this configuration, the band-pass filter 91 performing a digital operation is disposed in the controller 14b (at the rear stage of the A/D converter 7).

By filtering the input signal from the A/D converter 7 by the use of the band-pass filter 91 in the controller 14b, a signal outside the desired signal band is extracted as an error signal e(t), the extracted error signal e(t) is digitalized by the use of the A/D converter 7, the adaptive algorithm unit 92 updates the pre-distortion learning coefficient (the details of which will be described later in the embodiment of the invention (after the [Configuration of First Embodiment])), for example, using an algorithm of the perturbation method on the basis of the error signal e(t) and the input signals from the filters 16 and 18.

In this embodiment, the band-pass filters 71 and 91 are used as the filter, but a band-limiting filter having the same filtering characteristic may be used in another configuration. For example, a FIR (Finite Impulse Response) filter is used as the band-limiting filter.

Here, the advantages obtained from the configuration according to this example shown in FIGS. 3(a) and 3(b) will be described in comparison with the configuration according to the background art shown in FIG. 12.

Figures 12, 13, 14:
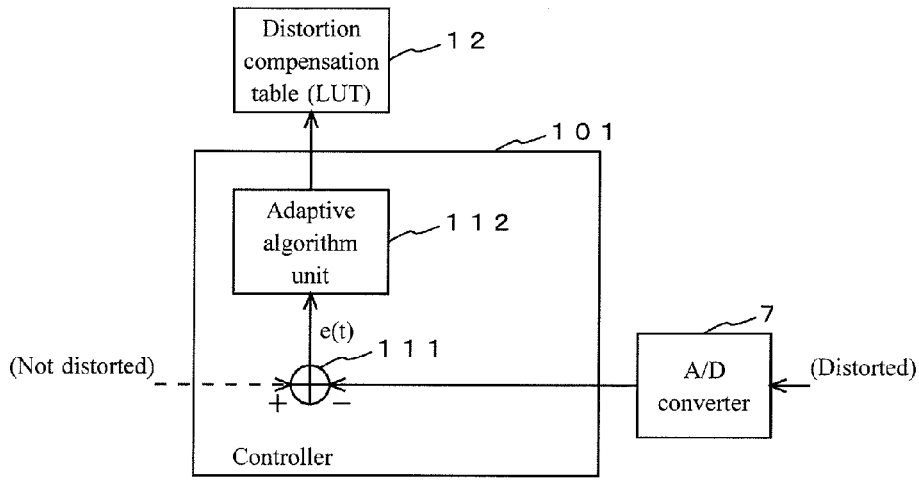
FIG. 12 is a diagram illustrating the configuration of a controller according to the background art.
FIG. 13 is a diagram illustrating an example of orthogonalization when any of the input filter and the feedback filter is not provided.
FIG. 14 is a diagram illustrating an example of orthogonalization when the feedback filter is provided but the input filter is not provided.

In the configuration according to the background art shown in FIG. 12, the power level of the distorted component frequency included in the feedback signal is considered as the error signal e(t), and an error is caused when the gain (Gain) or the phase (time τ) of the feedback signal is not matched with that of the original signal, whereby the level matching is necessary.

On the contrary, in the configuration according to this example shown in FIGS. 3(a) and 3(b), by extracting the signal component (that is, the distortion component) other than the desired-wave signal as an error signal (for example, an error vector in the time domain of the distortion band) by the use of the band-pass filters 71 and 91 using only the feedback signal, it is possible to decrease the precision required for matching the time or the like.

In this way, in this embodiment, since the level adjustment necessary in the configuration according to the background art shown in FIG. 12 need not be performed and a desired signal with great power is not included, the precision for the delay time is alleviated. That is, the precise level adjustment due to the waveform comparison method or the delay time adjustment is not necessary. The distortion existing in the desired band is removed by the band-pass filters 71 and 91 and thus is not included in the error signal e(t), but the error signal inside the desired signal band becomes closer to 0 as the error signal e(t) outside the desired signal band becomes closer to 0, thereby causing no particular problem.

As described above, in the amplifier with a pre-distorter according to this example, the pre-distortion learning coefficient is learned using the signal, which is obtained by attenuating or removing the desired signal from the output signal of the amplifier (the amplifier of the power amplification unit 4 in this embodiment), as an error signal e(t).

Therefore, in the amplifier with a pre-distorter according to this example, by using the signal, from which the signal of the desired signal band is removed by the band-pass filters 71 and 91, as the error signal e(t), for example, complex processes (operations) in the configuration shown in FIG. 3 are not required and the circuit scale is reduced, thereby simplifying the processes and thus shortening the time of convergence. In this way, it is possible to efficiently converge the distortion compensation coefficient (for example, the details of the distortion compensation table 12 defining the pre-distortion) for executing the pre-distortion in this embodiment.

First Embodiment

A first embodiment of the invention will be described.

In this embodiment, an example where a memoryless pre-distorter is used will be described.

First, the background of the configuration according to this example using a set of orthogonal polynomials will be described in detail.

Figures 4, 5, 6:
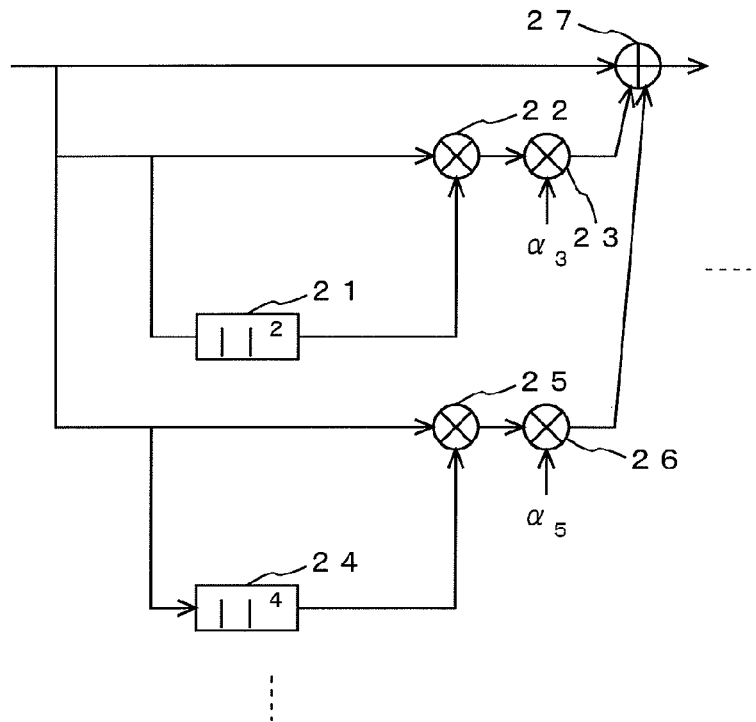
FIG. 4 is a diagram illustrating the configuration of a memoryless pre-distorter.
FIG. 5 is a diagram illustrating an example of orthogonalization when both an input filter and a feedback filter are provided according to an embodiment of the invention.
FIG. 6 is a diagram illustrating an example of orthogonalization when the feedback filter is provided but the input filter is not provided according to an embodiment of the invention.

FIG. 4 shows the configuration of the memoryless pre-distorter using an expansion in a power series as a reference. It is shown as a principal configuration that the memoryless pre-distorter according to this embodiment corresponds to the pre-distorter 1 shown in FIG. 1.

The memoryless pre-distorter according to this embodiment includes a second power detector 21, a multiplier 22, and a complex multiplier 23 as a processing unit for a third-order term, includes a fourth power detector 24, a multiplier 25, and a complex multiplier 26 as a processing unit for a fifth-order term, and includes the same processing units (not shown) for odd-order terms of a seventh-order term or a term subsequent thereto. In an actual circuit, since the processing units cannot be provided for infinite-order terms, processing units for a predetermined order (a predetermined odd order of a third order or higher) effective in practical use.

The memoryless pre-distorter according to this embodiment includes an adder 27 as a processing unit common to all the orders.

In the memoryless pre-distorter according to this embodiment, the input signal is a complex signal.

In the processing unit for the third-order term, the second power detector 21 detects (for example, calculates) the value of the second power of the input signal and the multiplier 22 multiplies the input signal by the value of the second power. In the resultant signal, the amplitude of the input signal is third-powered and the phase is maintained. The complex multiplier 23 complex-multiplies the resultant signal by a coefficient $\alpha_3$ of the pre-distorter. The coefficient $\alpha_3$ of the pre-distorter is a complex number and is set to compensate for the distortion by the controller (not shown in FIG. 4).

In the processing unit for the fifth-order term, the fourth power detector 24 detects (for example, calculates) the value of the fourth power of the input signal and the multiplier 25 multiplies the input signal by the value of the fourth power. In the resultant signal, the amplitude of the input signal is fifth-powered and the phase is maintained. The complex multiplier 26 complex-multiplies the resultant signal by a coefficient $\alpha_5$ of the pre-distorter. The coefficient $\alpha_5$ of the pre-distorter is a complex number and is set to compensate for the distortion by the controller (not shown in FIG. 4).

In the processing units for the odd-order terms of the seventh-order term or terms subsequent thereto, the same processes are performed.

The adder 27 adds the signals output from the processing units (the complex multipliers 23, 26, . . . ) for all the odd-order terms and the input signal and outputs the addition result as the pre-distorted signal (to the D/A converter 2 in FIG. 1).

Referring to FIG. 2, an example of a calculating expression using an expansion of a power series according to the background art will be described when the memoryless pre-distorter shown in FIG. 4.

The input signal x(t) is a complex signal.

The amplitude detector 11 calculates the amplitude value |x(t)| of the input signal x(t). When the input signal x(t) is expressed by Expression 5, the amplitude value |x(t)| is expressed by Expression 6.

$$x(t)=I(t)+jQ(t) \quad \text{Expression 5}$$

$$|x(t)|=\sqrt{(I(t)^2+Q(t)^2)} \quad \text{Expression 6}$$

In the per-distorter, the signal p(t) added to the input signal x(t) is generally expressed as Expression 7. Here, $\alpha_i$ is the coefficient of the pre-distorter and is a complex number. Expression 7 is expressed by a power series similarly to Expression 1 and it is possible to compensate for the non-linear distortion component of Expression 1 by appropriately selecting $\alpha_i$.

$$p(t)=\alpha_3|x(t)|^2 x(t)+\alpha_5|x(t)|^4 x(t)+\alpha_7|x(t)|^6 x(t)+\ldots \quad \text{Expression 7}$$

Since p(t) is expressed as Expression 7, the output signal LUT|x(t)| of the distortion compensation table 12 is expressed as Expression 8. Data expressed by Expression 8 is stored in the distortion compensation table (LUT) 12 including a memory by the controller 14.

$$LUT(|x(t)|)=\alpha_3|x(t)|^2+\alpha_5|x(t)|^4+\alpha_7|x(t)|^6+\ldots \quad \text{Expression 8}$$

Here, by considering the non-linear component of the amplifier (the amplifier of the power amplification unit 4) up the third order, Expression 1 and Expression 7 are expressed as Expression 9 and Expression 10, respectively.

$$y(t)=\text{Gain}\cdot z(t)+D_3|z(t)|^2 z(t) \quad \text{Expression 9}$$

$$p(t)=\alpha_3|x(t)|^2 x(t) \quad \text{Expression 10}$$

The input signal z(t) of the amplifier is a signal obtained by adding a pre-distorter signal p(t) expressed by Expression 10 to the input signal x(t) and is expressed by Expression 11.

$$z(t)=x(t)+p(t)=x(t)+\alpha_3|x(t)|^2 x(t) \quad \text{Expression 11}$$

By substituting z(t) expressed by Expression 11 for Expression 9, Expression 12 is obtained and Expression 13 is also obtained.

$$y(t)=\text{Gain}\cdot\{x(t)+\alpha_3|x(t)|^2 x(t)\}+D_3|x(t)+\alpha_3|x(t)|^2 x(t)|^2\{x(t)+\alpha_3|x(t)|^2 x(t)\} \quad \text{Expression 12}$$

$$y(t)=\text{Gain}\cdot x(t)+(\text{Gain}\cdot\alpha_3+D_3)|x(t)|^2 x(t)+D_3(2\alpha_3+\alpha_3)|x(t)|^4 x(t)+D_3(\alpha_3^2+2\alpha_3^2)|x(t)|^6 x(t)+D_3\alpha_3^3|x(t)|^8 x(t) \quad \text{Expression 13}$$

The first term of the right side of Expression 13 represents the amplified desired signal. The second term of the right side represents the third-order distortion component and $\alpha_3$ is determined so as to compensate for the distortion. It can be seen that the fifth-order component, the seventh-order component, and the ninth-order component are newly created in the third to fifth terms of the right side.

Therefore, in Expression 10, when the higher orders (the fifth order, the seventh order, . . . ) of the pre-distorter are considered, the third-order coefficient of the $\alpha_3$ of the pre-distorter affects the fifth-order coefficient $\alpha_5$ of the pre-distorter, the seventh-order coefficient $\alpha_7$ of the pre-distorter, the ninth-order coefficient $\alpha_9$ of the pre-distorter, and the like, whereby the optimal values of $\alpha_5$, $\alpha_7$, $\alpha_9$, and the like vary depending on the value of $\alpha_3$.

Because of this phenomenon, the method according to the background art has a problem in that much time is required for causing the coefficients ($\alpha_3$, $\alpha_5$, $\alpha_7$, and the like) of the memoryless pre-distorter to adaptively converge.

In Expression 9, the non-linear components of the amplifier are considered up to the third order. However, when the higher orders such as the fifth order and the seventh order are considered, the higher-order coefficients of the pre-distorter are affected.

Configuration of First Embodiment

The configuration of this embodiment using the set of orthogonal polynomials will be described below in detail.

To solve the above-mentioned problem, a set of orthogonal polynomials is used as a polynomial for generating the inverse characteristic of the non-linear characteristic in this embodiment.

In this embodiment, the polynomials of plural pre-distorters are made to be orthogonal to each other using the set of orthogonal polynomials, and thus the coefficients thereof are made to be independent of each other so as not to affect each other, thereby shortening the time of convergence. An example thereof is described below.

First, Expression 7 is expressed by Expression 14 and Expression 15. Here, $A_i$ represents the pre-distortion learning coefficient, $\phi_{ij}$ which is a parameter for orthogonalization (orthogonalization coefficient) is a real number, and N is an odd number.

$$p(t)= \quad \text{Expression 14}$$
$$A_3\Phi_3(x(t))+A_5\Phi_5(x(t))+A_7\Phi_7(x(t))+\ldots+A_N\Phi_N(x(t))$$

When the input signal x(t) during a certain time (0 to T) satisfies Expression 16, $\Phi(\Phi_3$ to $\Phi_N)$ in Expression 15 are orthogonal to each other. The function E[·] is defined as Expression 17.

Here, the time T of the time (0 to T) is a length of time of data used in one updating time. Since the larger length of time causes a smaller error, it is ideally preferable that the time T is infinite, but a value effective in practical use may be used. For example, when the details of the distortion compensation table 12 are updated every time, different signals should be made to be orthogonal to each other every time. Accordingly, a time with such a length (or larger) that an amplitude distribution of the input signals sufficient to orthogonalize them is obtained can be used every time, and for example, the time with such a length (or larger) that the probability density equivalent to that of the original signal is obtained can be used.

$$E[\Phi_i(x(t))\Phi_j(x(t))^*]=1 \quad (i=j)$$

$$E[\Phi_i(x(t))\Phi_j(x(t))^*]=0 \quad (i \neq j) \quad \text{Expression 16}$$

$$E[f(t)]=1/T\int_0^T f(t)dt \quad \text{Expression 17}$$

By appropriately selecting the values of in Expression 15, Expression 16 can be satisfied. The value of the parameter $\phi_{ij}$ varies depending on the input signal x(t) for the time (0 to T).

Hereinafter, the function E[·] is used. For the purpose of simple explanation, two cases of $\Phi_3$ expressed by Expression 18 and $\Phi_5$ expressed by Expression 19 are described.

To orthogonalize $\Phi_3$ and $\Phi_5$, the relation of Expression 16 needs to be satisfied and thus equations of Expression 20, Expression 21, and Expression 22 can be established.

$$\Phi_3(x(t)) = \phi_{33}|x(t)|^2 x(t) \quad \text{Expression 18}$$

$$\Phi_5(x(t)) = \phi_{53}|x(t)|^2 x(t) + \phi_{55}|x(t)|^4 x(t) \quad \text{Expression 19}$$

$$E[\Phi_3 \Phi_3^*] = E[(\phi_{33}|x(t)|^2 x(t)) \cdot (\phi_{33}|x(t)|^2 x(t))^*] \quad \text{Expression 20}$$
$$= \phi_{33}^2 E[|x(t)|^6]$$
$$= 1$$

$$E[\Phi_3 \Phi_5^*] = E[(\phi_{33}|x(t)|^2 x(t)) \cdot \quad \text{Expression 21}$$
$$(\phi_{53}|x(t)|^2 x(t) + \phi_{55}|x(t)|^4 x(t))^*]$$
$$= \phi_{33} \cdot (\phi_{53} E[|x(t)|^6] + \phi_{55} E[|x(t)|^8])$$
$$= 0$$

$$E[\Phi_5 \Phi_5^*] = E[(\phi_{53}|x(t)|^2 x(t) + \phi_{55}|x(t)|^4 x(t)) \cdot \quad \text{Expression 22}$$
$$(\phi_{53}|x(t)|^2 x(t) + \phi_{55}|x(t)|^4 x(t))^*]$$
$$= \phi_{53}^2 E[|x(t)|^6] + 2\phi_{53}\phi_{55} E[|x(t)|^8] +$$
$$\phi_{55}^2 E[|x(t)|^{10}]$$
$$= 1$$

Since three simultaneous equations of Expression 20, Expression 21, and Expression 22 are given for three unknowns $\phi_{33}$, $\phi_{53}$, and $\phi_{55}$, these can be solved.

First, by solving Expression 20 for $\phi_{33}$, Expression 23 is obtained.

Then, Expression 24 is obtained from Expression 21.

$$\phi_{33} = 1/\sqrt{E[|x(t)|^6]} \quad \text{Expression 23}$$

$$\phi_{53} = -\phi_{55}(E[|x(t)|^8]/E[|x(t)|^6]) \quad \text{Expression 24}$$

By substituting Expression 24 for Expression 22, Expression 25 is obtained and Expression 26 is also obtained.

By substituting Expression 26 for Expression 24, Expression 27 is obtained.

In this way, the set of orthogonal polynomials can be generated.

$$\phi_{55}^2(E[|x(t)|^8]^2/E[|x(t)|^6]) - 2\phi_{55}^2($$
$$E[|x(t)|^8]^2/E[|x(t)|^6]) + \phi_{55}^2 E[|x(t)|^{10}] = 1 \quad \text{Expression 25}$$

$$\phi_{55} = \sqrt{\{E[|x(t)|^6]/(E[|x(t)|^6] \cdot E[|x(t)|^{10}] - E[|x(t)|^8]^2)\}} \quad \text{Expression 26}$$

$$\phi_{53} = -(E[|x(t)|^8]/E[|x(t)|^6])/ \quad \text{Expression 27}$$
$$\sqrt{\{E[|x(t)|^6]/(E[|x(t)|^6] \cdot E[|x(t)|^{10}] - E[|x(t)|^8]^2)\}}$$

When the amplifier generates higher-order non-linear distortion, a higher-order characteristic is necessary for the inverse characteristic of a digital pre-distorter (DPD) and thus $\Phi_7$, $\Phi_9$, ... of higher-order terms are used.

For example, when $\Phi_3$, $\Phi_5$, and $\Phi_7$ are orthogonalized, it is necessary to satisfy the simultaneous equations expressed by Expression 28. In this case, since six equations are given for six unknowns $\phi_{33}$, $\phi_{53}$, $\phi_{55}$, $\phi_{73}$, $\phi_{75}$, and $\phi_{77}$, these can be solved. Similarly, the orthogonalization can be extended to the $\Phi_9$ or higher order.

$$E[\Phi_3 \Phi_3^*] = 1$$
$$E[\Phi_3 \Phi_5^*] = 0$$
$$E[\Phi_5 \Phi_5^*] = 1$$
$$E[\Phi_3 \Phi_7^*] = 0$$
$$E[\Phi_5 \Phi_7^*] = 0$$
$$E[\Phi_7 \Phi_7^*] = 1 \quad \text{Expression 28}$$

$\alpha_3$, $\alpha_5$, $\alpha_7$, ..., and $\alpha_N$ are expressed by Expression 29 using $A_3$, $A_5$, $A_7$, ..., and $A_N$ in Expression 14.

$$\alpha_3 = \phi_{33} A_3 + \phi_{53} A_5 + \phi_{73} A_7 + \ldots + \phi_{N3} A_N \quad \text{Expression 29}$$
$$\alpha_5 = \phi_{55} A_5 + \phi_{75} A_7 + \ldots + \phi_{N5} A_N$$
$$\alpha_7 = \phi_{77} A_7 + \ldots + \phi_{N7} A_N$$
$$\ldots$$
$$\alpha_N = \phi_{NN} A_N$$

In this embodiment, the values of $\alpha_i$ (i=3, 5, 7, ..., and N) obtained from Expression 29 are applied to Expression 8, which is applied to the amplifier with a pre-distorter according to this embodiment shown in FIGS. 1 to 4.

In this case, the pre-distortion learning coefficient $A_i$ affects only $\Phi_i$, that is, can be obtained independent of other pre-distortion learning coefficients $A_j$ (i≠j), thereby shortening the time of convergence. Specifically, for example, the number of updating times until the details of the distortion compensation table 12 are converged to an initial state (for example, a state without any information) is reduced.

In this way, in the amplifier with a pre-distorter according to this embodiment, when the adaptive coefficients of the memoryless pre-distorter are learned using the set of orthogonal polynomials, the pre-distortion learning coefficients to be adapted are orthogonalized by using the set of orthogonal polynomials and it is thus possible to shorten the time of convergence of the distortion compensation table 12, thereby accomplishing an increase in efficiency.

The specific configuration of the amplifier with a pre-distorter will be described below in detail.

In the configuration using the set of orthogonal polynomials, it is possible to accomplish an additional increase in efficiency without maximally utilizing the effect of the set of orthogonal polynomials while shortening the time of convergence. Accordingly, the configuration for accomplishing the additional increase in efficiency is described in this embodiment.

First, a problem of the configuration using the set of orthogonal polynomials will be described.

Figure 11:
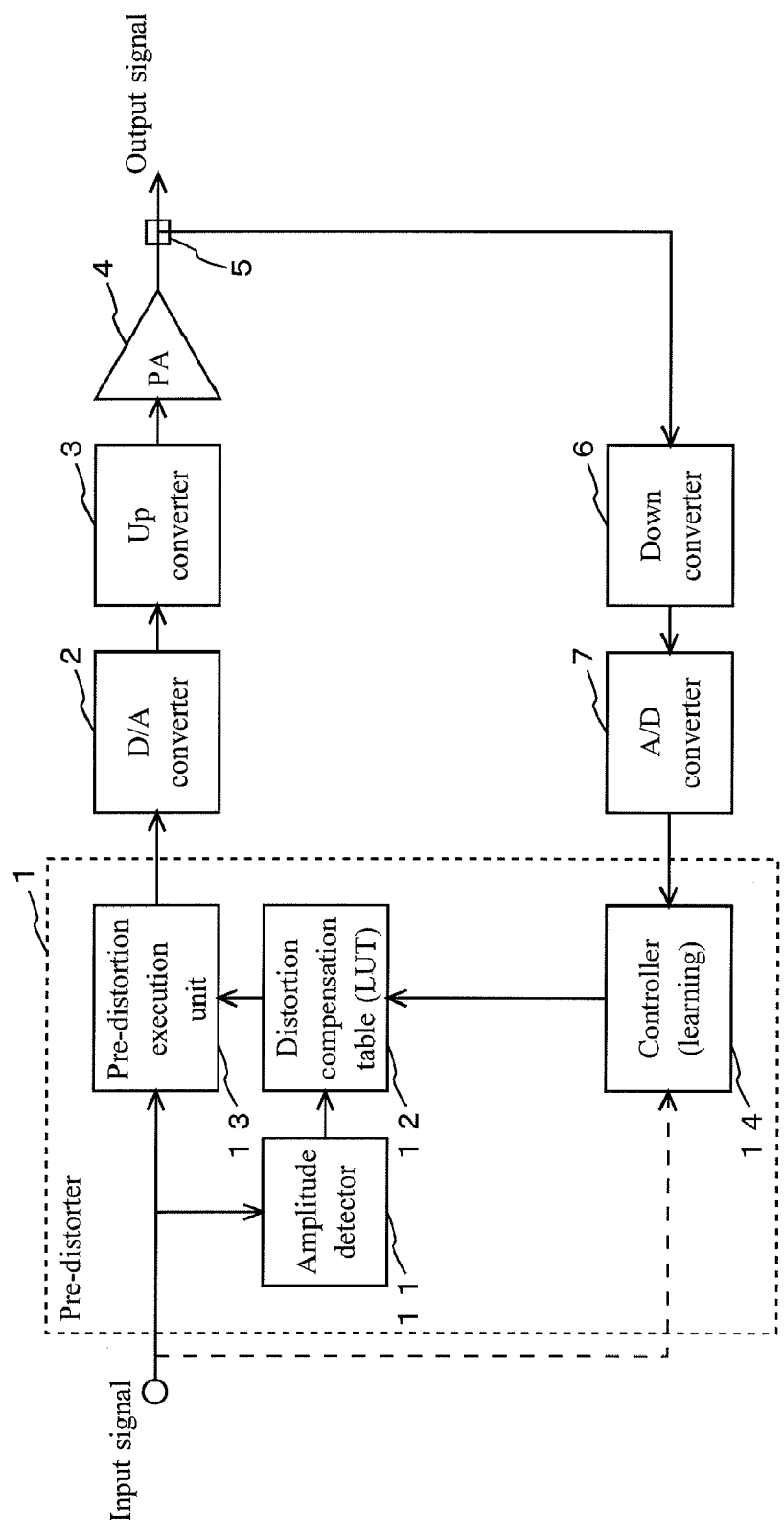
FIG. 11 is a diagram illustrating the configuration of the amplifier with a pre-distorter.

FIG. 13 shows an example of $E[\Phi_m^* \cdot \Phi_n]$ when an input filter (corresponding to the filters 16 and 18 shown in FIG. 1) and a feedback filter (corresponding to the filter 8 shown in FIG. 1) are not provided like the configuration of the amplifier with a pre-distorter shown in FIG. 11 and when the waveform comparison method is used, for example, as shown in FIG. 12. A W-CDMA (Wideband-Code Division Multiple Access) signal is used as a transmission signal.

Here, Expression 14 or Expression 15 or Expression 17 is established.

$A_i$ represents a coefficient for distortion compensation (the pre-distortion learning coefficient). $\phi_{ij}$ is a parameter for orthogonalization (orthogonalization coefficient) for orthogonalizing the orthogonal function $\Phi_i$.

In the table shown in FIG. 13, the components $\Phi_3^*$, $\Phi_5^*$, and $\Phi_7^*$ of the input-side (transmission-side) signal are shown in the row (in the longitudinal direction) and the case where the input filters 16 and 18 shown in FIG. 1 are not provided is shown.

The components $\Phi_3$, $\Phi_5$, and $\Phi_7$ of the error signal on the feedback side are shown in the column (lateral direction), and the case where the feedback filter 8 shown in FIG. 1 is not provided is shown.

In the example shown in FIG. 13, when the level or the delay time of a transmission signal and a feedback signal are ideally adjusted to obtain an error signal, it is confirmed that they are completely orthogonal to each other.

FIG. 14 shows an example of $E[(\Phi_m^* \cdot \Phi_n]$ when the feedback filter (corresponding to the filter 8 shown in FIG. 1) is provided but the input filter (corresponding to the filters 16 and 18 shown in FIG. 1) is not provided like the configuration of the amplifier with a pre-distorter shown in FIG. 1. A W-CDMA (Wideband-Code Division Multiple Access) signal is used as a transmission signal.

Here, Expression 14 or Expression 15 or Expression 17 is established.

$A_i$ represents a coefficient for distortion compensation (the pre-distortion learning coefficient). $\phi_{ij}$ is a parameter for orthogonalization (orthogonalization coefficient) for orthogonalizing the orthogonal function $\Phi_i$.

In the table shown in FIG. 14, the components $\Phi_3^*$, $\Phi_5^*$, and $\Phi_7^*$ of the input-side (transmission-side) signal are shown in the row (in the longitudinal direction) and the case where the input filters 16 and 18 shown in FIG. 1 are not provided is shown.

The components $\Phi_3$, $\Phi_5$, and $\Phi_7$ of the error signal on the feedback side are shown in the column (in the lateral direction), and the case where the feedback filter 8 shown in FIG. 1 is provided is shown.

In the example shown in FIG. 14, it is confirmed that $E[\Phi_m^* \cdot \Phi_n]$ (m=n) is greater than $E[\Phi_m^* \cdot \Phi_n]$ (m≠n) but the orthogonalization thereof is damaged.

Therefore, the method of shortening the time of convergence and reducing the hardware scale has room for improvement and there is thus a need for development of a more efficient method.

Therefore, in this embodiment, it is further improved.

The specific configuration of the amplifier with a pre-distorter according to this example will be described below.

Roughly, in this embodiment, when the orthogonalization coefficient $\phi_{ij}$ as a parameter is calculated, for example a signal in which a desired signal band is suppressed by a filter including a BPF is used. In this embodiment, the filter is described as the BPF.

In this embodiment, the characteristic of the filter is the same as the characteristic of the feedback filter 8 or the input filters 16 and 18, and all the filters have the same filter characteristic.

Specifically, since attention is paid to the odd-order non-linear distortion considered by a general pre-distorter, the orders to be handled are the third order, the fifth order, the seventh order, . . . , and the N-th order (where N is an odd number).

The set of orthogonal polynomials in which the desired signal band is suppressed by the BPF is defined as Expression 30. Here, BPF[ ] represents the signal in which the desired signal band is suppressed.

$$\Phi_3(x(t)) = \phi_{33} BDF\,[|x(t)|^2 x(t)] \qquad \text{Expression 30}$$

$$\Phi_5(x(t)) = \phi_{53} BDF\,[|x(t)|^2 x(t)] +$$

$$\phi_{55} BDF\,[|x(t)|^4 x(t)]$$

$$\Phi_7(x(t)) = \phi_{73} BDF\,[|x(t)|^2 x(t)] +$$

$$\phi_{75} BDF\,[|x(t)|^4 x(t)] +$$

$$\phi_{77} BDF\,[|x(t)|^6 x(t)] \ldots$$

$$\Phi_N(x(t)) = \phi_{N3} BDF\,[|x(t)|^2 x(t)] +$$

$$\phi_{N5} BDF\,[|x(t)|^4 x(t)] +$$

$$\phi_{N7} BDF\,[|x(t)|^6 x(t)] + \ldots +$$

$$\phi_{NN} BDF\,[|x(t)|^{N-1} x(t)]$$

When the input signal x(t) during a certain time (0 to T) satisfies Expression 16 and Expression 17, $\Phi_3$ to $\Phi_N$ in Expression 30 are orthogonal to each other.

In this embodiment, the orthogonalization coefficient $\phi_{ij}$ as a parameter is calculated using Expression 30 instead of Expression 15. The same method as using Expression 15 can be used as the calculation method.

Both are different from each other in that Expression 31 is established in the method using Expression 15 but Expression 32 is established in the method using Expression 30. Accordingly, different orthogonalization coefficients $\phi_{ij}$ are obtained.

$$(|x(t)|^2 x(t)) \cdot (|x(t)|^6 x(t)^*) = (|x(t)|^4 x(t))(|x(t)|^4 x(t)^*) = |x(t)|^{10} \quad \text{Expression 31}$$

$$BPF[|x(t)|^2 x(t)] \cdot BPF[|x(t)|^6 x(t)] * \neq \qquad \text{Expression 32}$$

$$BPF[|x(t)|^4 x(t)] \cdot BPF[|x(t)|^4 x(t)] *$$

In this embodiment, the orthogonalization coefficient $\phi_{ij}$ as a parameter is calculated from the input signal x(t). Specifically, the orthogonalization coefficient can be calculated using a sufficiently long signal having general characteristics of signals (for example, characteristic such as CDMA or OFDM (Orthogonal Frequency Division Multiplexing).

In this embodiment, when the orthogonalization coefficient $\phi_{ij}$ as a parameter is first calculated using Expression 30, for example, by a computer simulation, the orthogonalization coefficient is fixed constant. Then, the orthogonal functions $\Phi_i$ are calculated using the orthogonalization coefficient $\phi_{ij}$.

The orthogonal function $\Phi_i$ varies depending on the input signal x(t) and temporally varies depending on the input-side component and the feedback component (distortion component).

FIG. 5 shows an example of $E[\Phi_m^* \cdot \Phi_n]$ when the orthogonalization coefficient $\phi_{ij}$ of the set of orthogonal polynomials is calculated using Expression 30 and the feedback filter 8 and the input filters 16 and 18 are provided like the configuration of the amplifier with a pre-distorter shown in FIG. 1. A W-CDMA signal is used as a transmission signal.

In the table shown in FIG. 5, the components $\Phi_3^*$, $\Phi_5^*$, and $\Phi_7^*$ of the input-side (transmission-side) signal are shown in the row (in the longitudinal direction) and the case where the input filters 16 and 18 shown in FIG. 1 are provided is shown.

The components $\Phi_3$, $\Phi_5$, and $\Phi_7$ of the error signal on the feedback side are shown in the column (in the lateral direction), and the case where the feedback filter 8 shown in FIG. 1 is provided is shown.

In the example shown in FIG. 5, it is confirmed that they are not completely orthogonal, but the degree of orthogonalization is great in comparison with the example shown in FIG. 14 where Expression 30 is not applied.

In this way, in the amplifier with a pre-distorter according to this embodiment, the amplitude of the transmission signal is raised to a power and the orthogonalization coefficient $\phi_{ij}$ of the set of orthogonal polynomials calculated using the signal obtained by limiting the band of the powered signal is used.

As in this embodiment, when the orthogonalization coefficient $\phi_{ij}$ of the set of orthogonal polynomials is calculated using Expression 30, it is possible to additionally shorten the time of convergence and to accomplish an increase in efficiency, for example, compared with the case where the orthogonalization coefficient $\phi_{ij}$ of the set of orthogonal polynomials is calculated using Expression 15.

In the configuration in which the orthogonalization coefficient $\phi_{ij}$ of the set of orthogonal polynomials is calculated using Expression 30, it is possible to simplify the processes by not using the band-limiting filter (for example, the filters 16 and 18 shown in FIG. 1) for the transmission-side signal.

FIG. 6 shows an example of $E[\Phi_m^* \cdot \Phi_n]$ when the orthogonalization coefficient $\phi_{ij}$ of the set of orthogonal polynomials is calculated using Expression 30 and the feedback filter 8 is provided like the configuration of the amplifier with a pre-distorter shown in FIG. 1 but the input filters 16 and 18 are not provided. A W-CDMA signal is used as a transmission signal.

In the table shown in FIG. 6, the components $\Phi_3^*$, $\Phi_5^*$, and $\Phi_7^*$ of the input-side (transmission-side) signal are shown in the row (in the longitudinal direction) and the case where the input filters 16 and 18 shown in FIG. 1 are not provided is shown.

The components $\Phi_3$, $\Phi_5$, and $\Phi_7$ of the error signal on the feedback side are shown in the column (in the lateral direction), and the case where the feedback filter 8 shown in FIG. 1 is provided is shown.

It is confirmed that the values of the table shown in FIG. 5 are completely equal to the values of the table shown in FIG. 6 and thus the same effect of orthogonalization is obtained.

Here, $E[\Phi_m^* \cdot \Phi_n]$ overlaps in the time domain and thus appears as a multiplication in the frequency domain. Since one side (here, the feedback side) is removed by the use of the band-limiting filter, that is, since 0.0 is multiplied, it is noted that the results are equal to each other.

In this way, in the amplifier with a pre-distorter according to this embodiment, when the amplitude of the transmission signal is raised to a power and the orthogonalization coefficient $\phi_{ij}$ of the set of orthogonal polynomials calculated using the signal obtained by limiting the band of the powered signal is used, it may be possible to limit the band of the feedback signal without limiting the band of the input-side signal (transmission signal), thereby learning the adaptive coefficients.

In this configuration, whenever the pre-distortion learning coefficient is updated, it is not necessary to limit the band of data of the time T [sec] (which is data acquisition time required for one update and which is an arbitrary value), thereby simplifying the processes.

Figure 7:
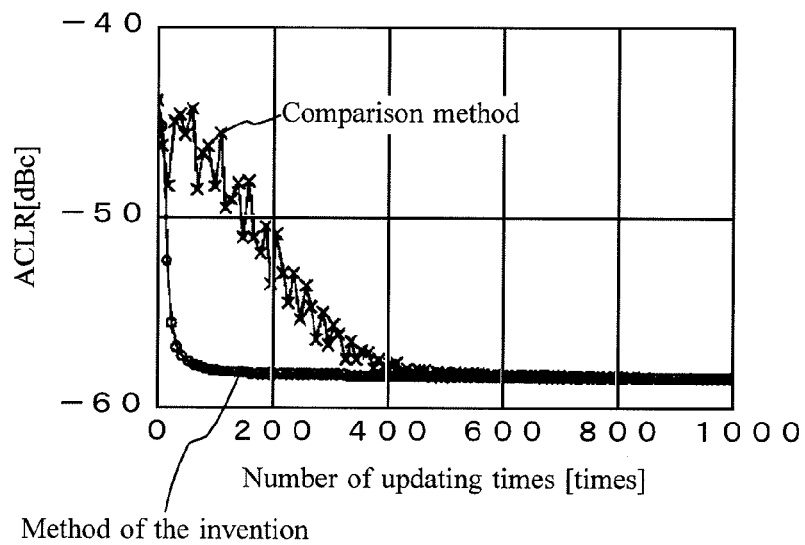
FIG. 7 is a diagram illustrating an example of an ACLR convergence procedure.

FIG. 7 shows an example of an ACLR convergence procedure when the orthogonalization coefficient $\phi_{ij}$ of the set of orthogonal polynomials is calculated using Expression 30 (the method of the invention) and when the orthogonalization coefficient $\phi_{ij}$ of the set of orthogonal polynomials is calculated using Expression 15 (the comparative method). The horizontal axis represents the number of updating times [times] and the vertical axis represents ACLR [dBc].

Comparing the time of convergence in the method of the invention and the comparative method, the ACLR is excellently converged by about 500 times in the comparative method and by about 100 times in the method of the invention. In the method of the invention, when the band-limiting filter is applied to the feedback signal, the degree of orthogonalization of the respective coefficients increases, that is, the coefficients are converged independently, whereby an effective advantage that the time of convergence is shortened is accomplished.

As described above, in the amplifier with a pre-distorter according to this embodiment, the signal obtained by suppressing the desired signal band by the use of the filter (the BPF in this embodiment) is used to calculate the orthogonalization coefficient $\phi_{ij}$.

In one configurational example, the bands of both the input-side signal and the feedback-side signal are limited using the filter (the BPF in this embodiment).

In another configurational example, at the time of calculating the learning estimation function of the pre-distortion learning coefficient $A_i$ using the LMS or the perturbation method, the desired signal is removed from the feedback signal corresponding to the error signal e(t) by the use of the filter (the BPF in this embodiment) and the band limitation is not performed on the orthogonal functions $\Phi_i$ of the set of orthogonal polynomials on the input side (transmission side) which are correlated herewith, thereby simplifying the processes.

Here, in the amplifier with a pre-distorter according to this embodiment, the orthogonalization coefficient $\phi_{ij}$ of the set of orthogonal polynomials is calculated using Expression 30 which considers the filter (the BPF in this embodiment), but the same processes as not considering the BPF are performed on the others. For example, the process of acquiring the $\Phi_i$ component signals in the $\Phi_i$ acquisition unit (the $\Phi_3$ acquisition unit 15 or the $\Phi_5$ acquisition unit 17 in this embodiment), the pre-distortion controlling process in the controller 14 or the distortion compensation table 12 or the pre-distortion execution unit 13, and the like are performed using Expression 15.

Second Embodiment

A second embodiment of the invention will be described.

In this embodiment, a case where the memory-effect pre-distorter is used will be described.

In the pre-distortion method, it is important to compensate for the AM-AM conversion or the AM-PM conversion and to compensate for the memory effect. For example, PTL 2 discloses a pre-distorter for compensating for a memory effect in which an even-order distortion component in a baseband changes a source voltage through the impedance of a power supply circuit to re-modulate the input signal and to newly generate an odd-order component in the band.

First, a problem in this embodiment will be described in detail.

Figure 8:
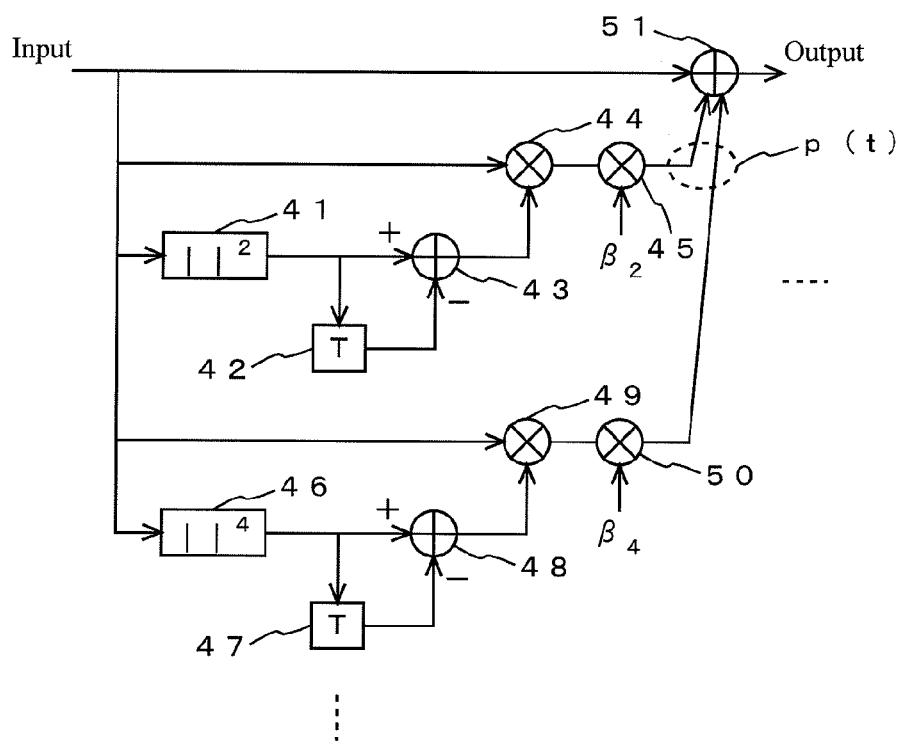
FIG. 8 is a diagram illustrating the configuration of a memory-effect pre-distorter.

FIG. 8 shows the configuration of the memory-effect pre-distorter using an expansion in a power series as a reference. It is shown as a principal configuration that the memory-effect pre-distorter according to this embodiment corresponds to the pre-distorter 1 shown in FIG. 1.

The memory-effect pre-distorter according to this embodiment includes a second power detector 41, a delay circuit 42, a subtractor 43, a multiplier 44, and a complex multiplier 45 as a processing unit for a second-order term, includes a fourth power detector 46, a delay circuit 47, a subtractor 48, a multiplier 49, and a complex multiplier 50 as a processing unit for a fourth-order term, and includes the same processing units (not shown) for even-order terms of a sixth-order term or a term subsequent thereto. In an actual circuit, since the processing units cannot be provided for infinite-order terms, processing units for a predetermined order (a predetermined even order of a second order or higher) effective in practical use.

The memory-effect pre-distorter according to this embodiment includes an adder 51 as a processing unit common to all the orders.

In the memory-effect pre-distorter according to this embodiment, the input signal is a complex digital baseband signal.

In the processing unit for the second-order term, the second power detector 41 detects (for example, calculates) the value of the second power of the signal input to the pre-distorter and the delay circuit 42 delays the output (the second power value) from the second power detector 41 by U [sec] (preferably by 1 clock time). The subtractor 43 subtracts the output (the second power value) of the second power detector 41 before U [sec] from the output (the second power value) of the second power detector 41. Accordingly, the output of the subtractor 43 is a difference between the second power values.

The multiplier 44 multiplies the input signal by the difference between the second power values. This output signal as the multiplication result corresponds to the signal obtained by re-modulating a carrier signal, is a third-order component, and has a frequency component in the vicinity of a carrier frequency.

The complex multiplier 45 complex-multiplies the output signal of the multiplier 44 by a coefficient $\beta_2$ of the pre-distorter. The coefficient $\beta_2$ of the pre-distorter is a complex number and is set to compensate for the distortion by the controller (not shown in FIG. 8).

In the processing unit for the fourth-order term, the fourth power detector 46 detects (for example, calculates) the value of the fourth power of the signal input to the pre-distorter and the delay circuit 47 delays the output (the fourth power value) from the fourth power detector 46 by U [sec] (preferably by 1 clock time). The subtractor 48 subtracts the output (the fourth power value) of the fourth power detector 46 before U [sec] from the output (the fourth power value) of the fourth power detector 46. Accordingly, the output of the subtractor 48 is a difference between the fourth power values.

The multiplier 49 multiplies the input signal by the difference between the fourth power values. This output signal as the multiplication result corresponds to the signal obtained by re-modulating a carrier signal, is a fifth-order component, and has a frequency component in the vicinity of a carrier frequency.

The complex multiplier 50 multiplies the output signal of the multiplier 49 by a coefficient $\beta_4$ of the pre-distorter. The coefficient $\beta_4$ of the pre-distorter is a complex number and is set to compensate for the distortion by the controller (not shown in FIG. 8).

In the processing units for the even-order terms of the sixth-order term or terms subsequent thereto, the same processes are performed.

The adder 51 adds (total sum) the signals output from the processing units (the complex multipliers 45, 50, for all the even-order terms and the input signal and outputs the addition result as the pre-distorted signal (to the D/A converter 2 in FIG. 1).

For example, the value of (1 clock time×integer of 1 or higher) can be used as U [sec].

Referring to FIG. 2, an example of a calculating expression using an expansion in a power series according to the background art will be described when the memory-effect pre-distorter is used shown in FIG. 8.

In this embodiment, the output signal p(t) of the memory-effect pre-distorter is expressed as Expression 33.

However, similarly to the memoryless pre-distorter according to the first embodiment (the coefficients of the pre-distorter compensating for the AM-AM conversion and the AM-PM conversion), there is a problem in that the time of convergence is elongated when $\beta_2$, $\beta_4$, ... are adapted.

$$p(t)=\beta_2\{|x(t)|^2-|^2-|x(t-U)|^2\}x(t)+\beta_4\{|X(t)|^4-|X(t-U)|^4\}x(t)+\ldots \quad \text{Expression 33}$$

The configuration according to this embodiment using the set of orthogonal polynomials will be described in detail.

To solve the above-mentioned problem, a set of orthogonal polynomials is used as a polynomial for generating the inverse characteristic of the memory-effect characteristic in this embodiment.

In this embodiment, the generation polynomials of the plural pre-distorters are made to be orthogonal to each other using the set of orthogonal polynomials, and thus the coefficients thereof are made to be independent of each other so as not to affect each other, thereby shortening the time of convergence. An example thereof is described below.

Expression 33 is expressed by Expression 34 and Expression 35.

$$p(t)=B_2\Phi_2(x(t))+B_4\Phi_4(x(t))+B_6\Phi_6(x(t))+\ldots+B_M\Phi_M(x(t)) \quad \text{Expression 34}$$

$$\Phi_2(x(t))=\phi_{22}\{|x(t)|^2-|x(t-U)|^2\}x(t)$$

$$\Phi_4(x(t))=\phi_{42}\{|x(t)|^2-|x(t-U)|^2\}x(t)+\phi_{44}\{|x(t)|^4-|x(t-U)|^4\}x(t)$$

$$\Phi_6(x(t))=\phi_{62}\{|x(t)|^2-|x(t-U)|^2\}x(t)+\phi_{64}\{|x(t)|^4-|x(t-U)|^4\}x(t)+\phi_{66}\{|x(t)|^6-|x(t)|^6-|x(t-U)|^6\}x(t)$$

$$\ldots$$

$$\Phi_M(x(t))=\phi_{M2}\{|x(t)|^2-x(t-U)|^2\}x(t)+\phi_{M4}\{|x(t-U)|^4\}x(t)+\phi_{M6}\{|x(t)|^6-|x(t-U)|^6\}x(t)+\ldots+\phi_{MM}\{|x(t)|^M-|x(t-U)|^M\}x(t) \quad \text{Expression 35}$$

Here, the orthogonalization coefficient $\phi_{ij}$ as a parameter is a real number and M is an even number.

Similarly to the first embodiment, when the input signal x(t) during a certain time (0 to T) satisfies Expression 16, $\Phi$ ($\Phi_2$ to $\Phi_M$) in Expression 35 are orthogonal to each other.

For the purpose of simple explanation, two cases of $\Phi_2$ and $\Phi_4$ will be described.

In this case, since three simultaneous equations expressed by Expression 36 are given for three unknowns $\phi_{22}$, $\phi_{42}$, and $\phi_{44}$, these can be solved, similarly to the pre-distorter compensating for the AM-AM conversion and the AM-PM conversion according to the first embodiment.

$$E[\Phi_2\Phi_2^*]=1$$

$$E[\Phi_2\Phi_4^*]=0$$

$$E[\Phi_4\Phi_4^*]=1 \quad \text{Expression 36}$$

When a polynomial including higher-order terms is used, they can be orthogonalized in the same way.

Similarly to Expression 29 described in the first embodiment, the relations between $B_2, B_4, B_6, \ldots,$ and $B_M$ and $\beta_2, \beta_4, \beta_6, \ldots,$ and $\beta_M$ can be obtained.

In this way, the pre-distortion learning coefficient $B_i$ affects only $\Phi_i$, that is, can be obtained independent of other pre-distortion learning coefficients $B_j$ ($i \neq j$), thereby shortening the time of convergence.

In this way, in the amplifier with a pre-distorter according to this embodiment, when the adaptive coefficients of the memory-effect pre-distorter are learned using the set of orthogonal polynomials, the pre-distortion learning coefficients to be adapted are orthogonalized by using the set of orthogonal polynomials and it is thus possible to shorten the time of convergence of the distortion compensation table 12, thereby accomplishing an increase in efficiency.

Specifically, in this embodiment, in the pre-distorter in which an input signal is raised to an even power and the memory effect is compensated for using a difference signal between the even-powered signal and the signal obtained by delaying the even-power signal, it is possible to rapidly adapt the pre-distortion learning coefficients for compensating for the memory effect by learning the adaptive coefficients of the pre-distorter using the set of orthogonal polynomials.

The specific configuration of the amplifier with a pre-distorter will be described below in detail.

In the configuration using the set of orthogonal polynomials, it is possible to accomplish an additional increase in efficiency without maximally utilizing the effect of the set of orthogonal polynomials while shortening the time of convergence. Accordingly, the configuration for accomplishing the additional increase in efficiency is described in this embodiment.

Roughly, in this embodiment, when the orthogonalization coefficient $\phi_{ij}$ is calculated, for example a signal in which a desired signal band is suppressed by a filter including a BPF is used. In this embodiment, the filter is described as the BPF.

In this embodiment, the characteristic of the filter is the same as the characteristic of the feedback filter 8 or the input filters 16 and 18, and all the filters have the same filter characteristic.

Specifically, since attention is paid to the even-order distortion considered by the pre-distorter, the orders to be handled are the second order, the fourth order, the sixth order, . . . , and the M-th order (where M is an even number).

The set of orthogonal polynomials in which the desired signal band is suppressed by the BPF is defined as Expression 37. Here, BPF[ ] represents the signal in which the desired signal band is suppressed.

$$\Phi_2(x(t)) = \phi_{22} BDF\left[\{|x(t)|^2 - |x(t-U)|^2\}x(t)\right]$$

$$\Phi_4(x(t)) = \phi_{42} BDF\left[\{|x(t)|^2 - |x(t-U)|^2\}x(t)\right] +$$
$$\phi_{44} BDF\left[\{|x(t)|^4 - |x(t-U)|^4\}x(t)\right]$$

$$\Phi_6(x(t)) = \phi_{62} BDF\left[\{|x(t)|^2 - |x(t-U)|^2\}x(t)\right] +$$
$$\phi_{64} BDF\left[\{|x(t)|^4 - |x(t-U)|^4\}x(t)\right] +$$
$$\phi_{66} BDF\left[\{|x(t)|^6 - |x(t-U)|^6\}x(t)\right] \ldots$$

$$\Phi_M(x(t)) = \phi_{M2} BDF\left[\{|x(t)|^2 - |x(t-U)|^2\}x(t)\right] +$$
$$\phi_{M4} BDF\left[\{|x(t)|^4 - |x(t-U)|^4\}x(t)\right] +$$
$$\phi_{M6} BDF\left[\{|x(t)|^6 -$$
$$|x(t-U)|^6\}x(t)\right] + \ldots +$$
$$\phi_{MM} BDF\left[\{|x(t)|^M - |x(t-U)|^M\}x(t)\right]$$

Expression 37

When the input signal x(t) during a certain time (0 to T) satisfies Expression 16 and Expression 17, $\Phi_2$ to $\Phi_M$ in Expression 37 are orthogonal to each other.

In this embodiment, the orthogonalization coefficient $\phi_{ij}$ as a parameter is calculated using Expression 37 instead of Expression 35. The same method as using Expression 35 can be used as the calculation method.

In this embodiment, the orthogonalization coefficient $\phi_{ij}$ as a parameter is calculated from the input signal x(t). Specifically, the orthogonalization coefficient can be calculated using a sufficiently long signal having general characteristics of signals (for example, characteristic such as CDMA or OFDM (Orthogonal Frequency Division Multiplexing)).

In this embodiment, when the orthogonalization coefficient $\phi_{ij}$ as a parameter is first calculated using Expression 37, for example, by a computer simulation, the orthogonalization coefficient is fixed constant. Then, the orthogonal functions $\Phi_i$ are calculated using the orthogonalization coefficient $\phi_{ij}$.

The orthogonal function $\Phi_i$ varies depending on the input signal x(t) and temporally varies on the input side and the feedback side (distortion component).

In this way, in the amplifier with a pre-distorter according to this embodiment, the amplitude of the transmission signal is raised to a power and the orthogonalization coefficient of the set of orthogonal polynomials calculated using the signal obtained by limiting the band of the powered signal is used.

As in this embodiment, when the orthogonalization coefficient $\phi_{ij}$ of the set of orthogonal polynomials is calculated using Expression 37, it is possible to additionally shorten the time of convergence and to accomplish an increase in efficiency, for example, compared with the case where the orthogonalization coefficient $\phi_{ij}$ of the set of orthogonal polynomials is calculated using Expression 35.

In the configuration in which the orthogonalization coefficient $\phi_{ij}$ of the set of orthogonal polynomials is calculated using Expression 37, it is possible to simplify the processes by not using the band-limiting filter (for example, the filters 16 and 18 shown in FIG. 1) for the transmission-side signal.

In this way, in the amplifier with a pre-distorter according to this embodiment, when the amplitude of the transmission signal is raised to a power and the orthogonalization coefficient $\phi_{ij}$ of the set of orthogonal polynomials calculated using the signal obtained by limiting the band of the powered signal is used, it may be possible to limit the band of the feedback signal without limiting the band of the input-side signal (transmission signal), thereby learning the adaptive coefficients.

In this configuration, whenever the pre-distortion learning coefficient is updated, it is not necessary to limit the band of data of the time T [sec] (which is data acquisition time required for one update and which is an arbitrary value), thereby simplifying the processes.

As described above, in the amplifier with a pre-distorter according to this embodiment, the signal obtained by suppressing the desired signal band by the use of the filter (the BPF in this embodiment) is used to calculate the orthogonalization coefficient $\phi_{ij}$.

In one configurational example, the bands of both the input-side signal and the feedback-side signal are limited using the filter (the BPF in this embodiment).

In another configurational example, at the time of calculating the learning estimation function of the pre-distortion learning coefficient $B_i$ using the LMS or the perturbation method, the desired signal is removed from the feedback signal corresponding to the error signal e(t) by the use of the filter (the BPF in this embodiment) and the band limitation is not performed on the orthogonal functions $\Phi_i$ of the set of orthogonal polynomials on the input side (transmission side) which are correlated therewith, thereby simplifying the processes.

Here, since the configuration using the set of orthogonal polynomials or the configuration calculating the orthogonalization coefficient $\phi_{ij}$ of the set of orthogonal polynomials by the use of Expression 37 using the filter (the BPF in this embodiment) are roughly the same as described in the first embodiment, the detailed processes thereof are the same as described in the first embodiment.

Third Embodiment

A third embodiment of the invention will be described.

In this embodiment, a case where both the memoryless pre-distorter and the memory-effect pre-distorter are used in parallel will be described.

Figure 9:
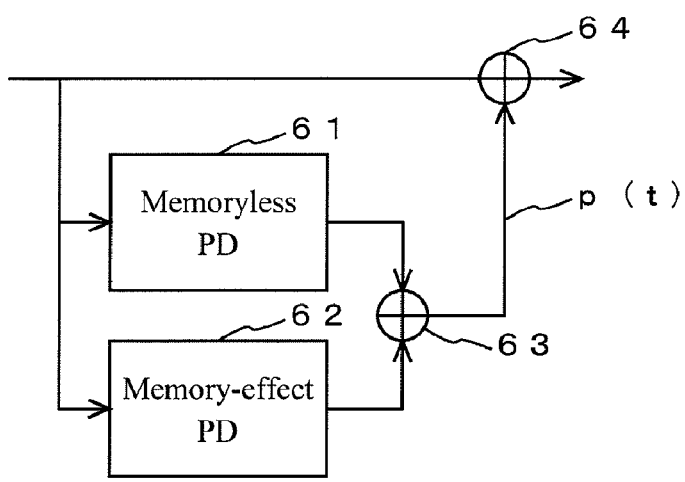
FIG. 9 is a diagram illustrating the configuration of a pre-distorter.

FIG. 9 shows the configuration of a pre-distorter according to an embodiment of the invention.

The pre-distorter according to this embodiment compensates for the memory effect in addition to the AM-AM conversion and the AM-PM conversion.

The pre-distorter according to this embodiment includes a memoryless pre-distorter (memoryless PD) 61, a memory-effect pre-distorter (memory-effect PD) 62, an adder 63, and an adder 64. In this embodiment, the memoryless PD 61 and the memory-effect PD 62 are disposed in parallel.

Here, the configuration having the principle shown in FIG. 4 can be used as the memoryless PD 61 and the configuration having the principle shown in FIG. 8 can be used as the memory-effect PD 62.

In the pre-distorter according to this embodiment, the memoryless PD 61 compensates for the AM-AM conversion and the AM-PM conversion of the signal input to the pre-distorter, the memory-effect PD 62 compensates for the memory effect of the signal input to the pre-distorter, the adder 63 adds both compensated signals, and the adder 64 adds the resultant signal p(t) to the signal input to the pre-distorter and outputs the addition result signal.

In this embodiment, the memoryless PD 61 and the memory-effect PD 62 constitute different processing units, respectively, and have different distortion compensation tables (the same as the distortion compensation table 12 shown in FIG. 1).

In this embodiment, the memoryless PD 61 and the memory-effect PD 62 correspond to the pre-distorter 1 shown in FIG. 1, and the adder 27 of the memoryless PD shown in FIG. 4 and the adder 51 of the memory-effect PD shown in FIG. 8 are commonly combined as the adder 64 shown in FIG. 9.

A set of orthogonal polynomials is used as a polynomial for generating the inverse characteristic of the non-linear characteristic in this embodiment.

In this embodiment, the polynomials for generating of plural pre-distorters are made to be orthogonal to each other using the set of orthogonal polynomials, and thus the coefficients thereof are made to be independent of each other so as not to affect each other, thereby shortening the time of convergence.

First, the configuration using the set of orthogonal polynomials according to this embodiment will be described in detail.

In this embodiment, the outputs signals of the pre-distorters 61 and 62 are added by the adder 63 and the resultant signal p(t) giving the inverse characteristic of the non-linear characteristic is added to the input signal by the adder 64.

Here, p(t) is expressed as Expression 38 using Expression 7 and Expression 33.

In this embodiment, Expression 38 is expressed by Expression 39 and Expression 40.

$$p(t) = \beta_2\{|x(t)|^2 - |x(t-U)|^2\}x(t) + \alpha_3|x(t)|^2 x(t) +$$
$$\beta_4\{|x(t)|^4 - |x(t-U)|^4\}x(t) + \alpha_5|x(t)|^4 x(t) +$$
$$\beta_6\{|x(t)|^6 - |x(t-U)|^6\}x(t) + \alpha_7|x(t)|^6 x(t) + \ldots$$

Expression 38

$$p(t) = B_2\Phi_2(x(t)) + A_3\Phi_3(x(t)) +$$
$$B_4\Phi_4(x(t)) + A_5\Phi_5(x(t)) + B_6\Phi_6(x(t)) +$$
$$A_7\Phi_7(x(t)) + \ldots + B_M\Phi_M(x(t)) + A_N\Phi_N(x(t))$$

Expression 39

$$\Phi_2(x(t)) = \phi_{22}\{|x(t)|^2 - |x(t-U)|^2\}x(t)$$

$$\Phi_3(x(t)) = \phi_{32}\{|x(t)|^2 - |x(t-U)|^2\}x(t) +$$
$$\phi_{33}|x(t)|^2 x(t)$$

$$\Phi_4(x(t)) = \phi_{42}\{|x(t)|^2 - |x(t-U)|^2\}x(t) +$$
$$\phi_{43}|x(t)|^2 x(t) +$$
$$\phi_{44}\{|x(t)|^4 - |x(t-U)|^4\}x(t)$$

$$\Phi_5(x(t)) = \phi_{52}\{|x(t)|^2 - |x(t-U)|^2\}x(t) +$$
$$\phi_{53}|x(t)|^2 x(t) +$$
$$\phi_{54}\{|x(t)|^4 - |x(t-U)|^4\}x(t) +$$
$$\phi_{55}|x(t)|^4 x(t)$$

$$\Phi_6(x(t)) = \phi_{62}\{|x(t)|^2 - |x(t-U)|^2\}x(t) +$$
$$\phi_{63}|x(t)|^2 x(t) +$$
$$\phi_{64}\{|x(t)|^4 - |x(t-U)|^4\}x(t) +$$
$$\phi_{65}|x(t)|^4 x(t) +$$
$$\phi_{66}\{|x(t)|^6 - |x(t-U)|^6\}x(t) \ldots$$

Expression 40

In this case, when equations are established as shown in Expression 41, the equations are given for the same number of unknowns. Accordingly, these can be solved to calculate $\phi_{ij}$.

In this case, since $B_2$, $A_3$, $B_4$, $A_5$, $B_6$, $A_7$, . . . are independent of each other, it is possible to shorten the time of convergence.

In this embodiment, the interaction between the memoryless PD 61 and the memory-effect PD 62 is reflected in Expression 40 and thus all the pre-distortion learning coefficients $A_d$ and $B_j$ can be orthogonalized.

$$E[\Phi_2\Phi_2^*] = 1$$

$$E[\Phi_2\Phi_3^*] = 0, \quad E[\Phi_3\Phi_3^*] = 1$$

$$E[\Phi_2\Phi_4^*] = 0, \quad E[\Phi_3\Phi_4^*] = 0, \quad E[\Phi_4\Phi_4^*] = 1$$

$$E[\Phi_2\Phi_5^*] = 0, \quad E[\Phi_3\Phi_5^*] = 0, \quad E[\Phi_4\Phi_5^*] = 0,$$

$$E[\Phi_5\Phi_5^*] = 1$$

Equation 41

-continued $$E[\Phi_2\Phi_6^*] = 0, \quad E[\Phi_3\Phi_6^*] = 0, \quad E[\Phi_4\Phi_6^*] = 0,$$
$$E[\Phi_5\Phi_6^*] = 0, \quad E[\Phi_6\Phi_6^*] = 1 \ldots$$

In this way, in the amplifier with a pre-distorter according to this embodiment, when the adaptive coefficients of the memoryless pre-distorter and the memory-effect pre-distorter are learned, the pre-distortion learning coefficients to be adapted are orthogonalized by using the set of orthogonal polynomials and it is thus possible to shorten the time of convergence of the distortion compensation table, thereby accomplishing an increase in efficiency.

Specifically, in this embodiment, in the pre-distorter in which the memoryless pre-distorter and the memory-effect pre-distorter are connected in parallel, by orthogonalizing and learning the adaptive coefficients of both pre-distorters using the set of orthogonal polynomials, it is possible to orthogonalize and rapidly adapt the coefficients of both the memoryless pre-distorter and the memory-effect pre-distorter.

The specific configuration of the amplifier with a pre-distorter will be described below in detail.

In the configuration using the set of orthogonal polynomials, it is possible to accomplish an additional increase in efficiency without maximally utilizing the effect of the set of orthogonal polynomials while shortening the time of convergence. Accordingly, the configuration for accomplishing the additional increase in efficiency is described in this embodiment.

Roughly, In this embodiment, when the orthogonalization coefficient $\phi_{ij}$ is calculated, for example a signal in which a desired signal band is suppressed by a filter including a BPF is used. In this embodiment, the filter is described as the BPF.

In this embodiment, the characteristic of the filter is the same as the characteristic of the feedback filter 8 or the input filters 16 and 18, and all the filters have the same filter characteristic.

Specifically, since attention is paid to the odd-order and even-order distortion considered by the pre-distorter, the orders to be handled are the third order, the fifth order, the seventh order, . . . , and the N-th order (where N is an odd number) and the second order, the fourth order, the sixth order, . . . , and the M-th order (where M is an even number).

The set of orthogonal polynomials in which the desired signal band is suppressed by the BPF is defined as Expression 42. Here, BPF[ ] represents the signal in which the desired signal band is suppressed.

$$\Phi_2(x(t)) = \phi_{22}BDF\left[\{|x(t)|^2 - |x(t-U)|^2\}x(t)\right] \quad \text{Expression 42}$$
$$\Phi_3(x(t)) = \phi_{32}BDF\left[\{|x(t)|^2 - |x(t-U)|^2\}x(t)\right] +$$
$$\phi_{33}BDF\left[|x(t)|^2 x(t)\right]$$
$$\Phi_4(x(t)) = \phi_{42}BDF\left[\{|x(t)|^2 - |x(t-U)|^2\}x(t)\right] +$$
$$\phi_{43}BDF\left[|x(t)|^2 x(t)\right] +$$
$$\phi_{44}BDF\left[\{|x(t)|^4 - |x(t-U)|^4\}x(t)\right]$$
$$\Phi_5(x(t)) = \phi_{52}BDF\left[\{|x(t)|^2 - |x(t-U)|^2\}x(t)\right] +$$
$$\phi_{53}BDF\left[|x(t)|^2 x(t)\right] +$$
$$\phi_{54}BDF\left[\{|x(t)|^4 - |x(t-U)|^4\}x(t)\right] +$$
$$\phi_{55}BDF\left[|x(t)|^4 x(t)\right]$$

-continued
$$\Phi_6(x(t)) = \phi_{62}BDF\left[\{|x(t)|^2 - |x(t-U)|^2\}x(t)\right] +$$
$$\phi_{63}BDF\left[|x(t)|^2 x(t)\right] +$$
$$\phi_{64}BDF\left[\{|x(t)|^4 - |x(t-U)|^4\}x(t)\right] +$$
$$\phi_{65}BDF\left[|x(t)|^4 x(t)\right]$$
$$\phi_{66}BDF\left[\{|x(t)|^6 - |x(t-U)|^6\}x(t)\right] \ldots$$

When the input signal x(t) during a certain time (0 to T) satisfies Expression 16 and Expression 17, $\phi_i$ in Expression 42 are orthogonal to each other.

In this embodiment, the orthogonalization coefficient $\phi_{ij}$ as a parameter is calculated using Expression 42 instead of Expression 40. The same method as using Expression 40 can be used as the calculation method.

In this embodiment, the orthogonalization coefficient $\phi_{ij}$ a parameter is calculated from the input signal x(t). Specifically, the orthogonalization coefficient can be calculated using a sufficiently long signal having general characteristics of signals (for example, characteristic such as CDMA or OFDM (Orthogonal Frequency Division Multiplexing)).

In this embodiment, when the orthogonalization coefficient $\phi_{ij}$ as a parameter is first calculated using Expression 42, for example, by a computer simulation, the orthogonalization coefficient is fixed constant. Then, the orthogonal functions $\Phi_i$ are calculated using the orthogonalization coefficient $\phi_{ij}$.

The orthogonal function $\Phi_i$ varies depending on the input signal x(t) and temporally varies depending on the input-side component and the feedback component (distortion component).

In this way, in the amplifier with a pre-distorter according to this embodiment, the amplitude of the transmission signal is raised to a power and the orthogonalization coefficient $\phi_{ij}$ of the set of orthogonal polynomials calculated using the signal obtained by limiting the band of the powered signal is used.

As in this embodiment, when the orthogonalization coefficient $\phi_{ij}$ of the set of orthogonal polynomials is calculated using Expression 42, it is possible to additionally shorten the time of convergence and to accomplish an increase in efficiency, for example, compared with the case where the orthogonalization coefficient $\phi_{ij}$ of the set of orthogonal polynomials is calculated using Expression 40.

In the configuration in which the orthogonalization coefficient $\phi_{ij}$ of the set of orthogonal polynomials is calculated using Expression 42, it is possible to simplify the processes by not using the band-limiting filter (for example, the filters 16 and 18 shown in FIG. 1) for the transmission-side signal.

In this way, in the amplifier with a pre-distorter according to this embodiment, when the amplitude of the transmission signal is raised to a power and the orthogonalization coefficient $\phi_{ij}$ of the set of orthogonal polynomials calculated using the signal obtained by limiting the band of the powered signal is used, it may be possible to limit the band of the feedback signal without limiting the band of the input-side signal (transmission signal), thereby learning the adaptive coefficients.

In this configuration, whenever the pre-distortion learning coefficient is updated, it is not necessary to limit the band of data of the time T [sec] (which is data acquisition time required for one update and which is an arbitrary value), thereby simplifying the processes.

As described above, in the amplifier with a pre-distorter according to this embodiment, the signal obtained by suppressing the desired signal band by the use of the filter (the BPF in this embodiment) is used to calculate the orthogonalization coefficient $\phi_{ij}$.

In one configurational example, the bands of both the input-side signal and the feedback-side signal are limited using the filter (the BPF in this embodiment).

In another configurational example, at the time of calculating the learning estimation function of the pre-distortion learning coefficients $A_i$ and $B_i$ using the LMS or the perturbation method, the desired signal is removed from the feedback signal corresponding to the error signal e(t) by the use of the filter (the BPF in this embodiment) and the band limitation is not performed on the orthogonal functions $\Phi_i$ of the set of orthogonal polynomials on the input side (transmission side) which are correlated therewith, thereby simplifying the processes.

Here, since the configuration using the set of orthogonal polynomials and the configuration calculating the orthogonalization coefficient $\phi_{ij}$ of the set of orthogonal polynomials by the use of Expression 42 using the filter (the BPF in this embodiment) are roughly the same as described in the first embodiment or the second embodiment, the detailed processes thereof are also the same as described in the first embodiment or the second embodiment.

In the memoryless pre-distorter 61 and the memory-effect pre-distorter 62 of this embodiment, the amplitude detector 11 may be disposed independently or commonly, the distortion compensation table 12 or the pre-distortion execution unit 13 may be disposed independently, the controller 14 or the feedback units (the directional coupler 5, the down converter 6, and the A/D converter 7) may be disposed commonly. In the memoryless pre-distorter 61 and the memory-effect pre-distorter 62 of this embodiment, the $\Phi_i$ acquisition unit (the $\Phi_3$ acquisition unit 15 or the $\Phi_5$ acquisition unit 17 in this embodiment) or the input filters 16 and 18 may be disposed commonly, and the feedback filter 8 may be disposed commonly.

Fourth Embodiment

Another configuration of the amplifier with a pre-distorter according to this embodiment will be described.

Figure 10:
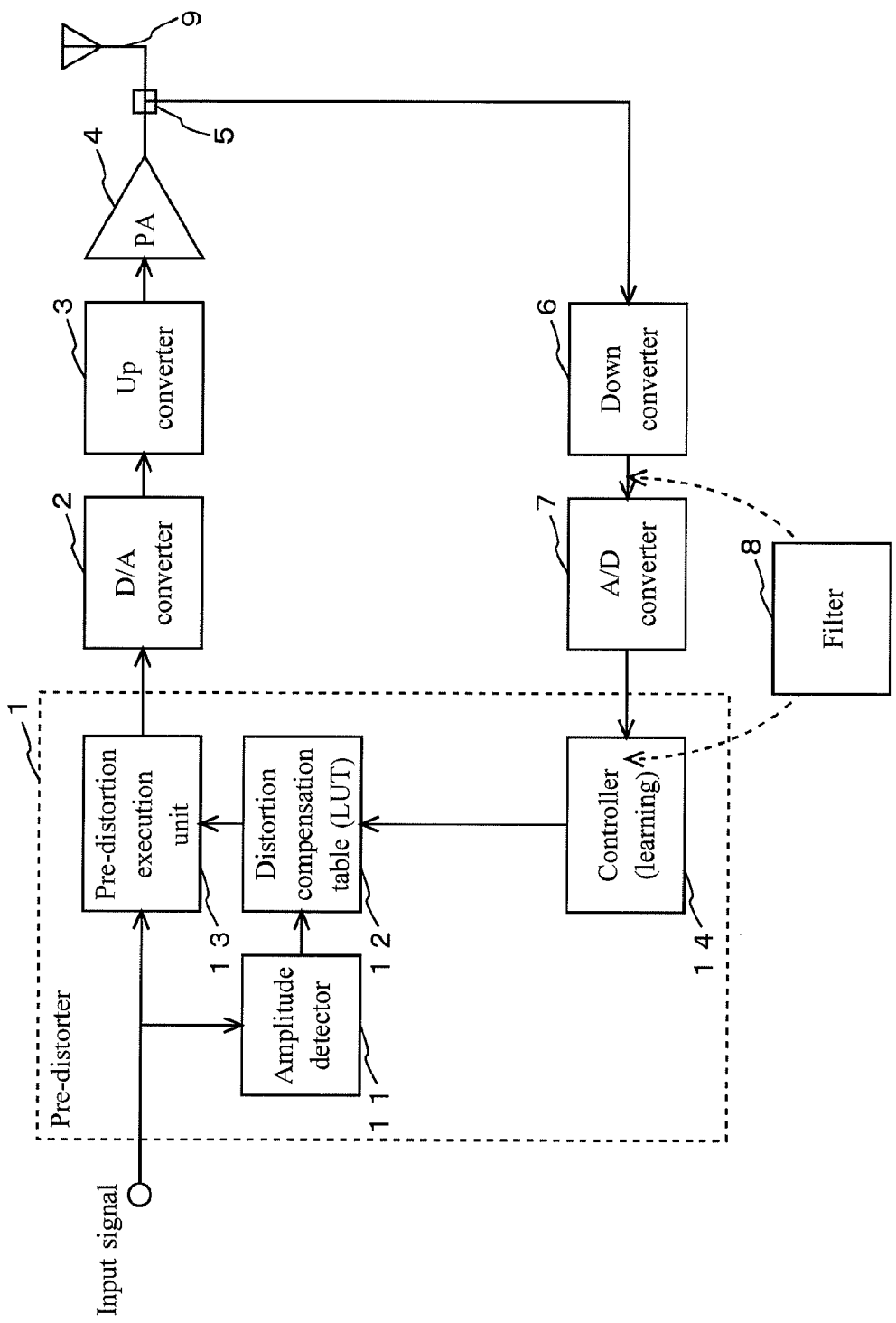
FIG. 10 is a diagram illustrating another configuration of the amplifier with a pre-distorter according to an embodiment of the invention.

FIG. 10 shows another configuration of the amplifier with a pre-distorter according to an embodiment of the invention.

The amplifier with a pre-distorter according to this embodiment is different in configuration or operation from the amplifier with a pre-distorter shown in FIG. 1, for example, in that the $\Phi_3$ acquisition unit 15, the filter 16, the $\Phi_5$ acquisition unit 17, and the filter 18 are not provided.

In the amplifier with a pre-distorter according to this embodiment, the controller 14 (for example, the adaptive algorithm units 81 and 92 shown in FIGS. 3(a) and 3(b)) updates the details (the correspondences of the distortion compensation coefficients and the amplitude values in this embodiment) stored in the distortion compensation table 12 so as to improve the distortion compensation by the pre-distortion execution unit 13 on the basis of the signal (signal passing through the filter 8) input from the A/D converter 7. By this update, for example, it is possible to cope with the temperature variation or the temporal variation.

In this case, the controller 14 performs control so as to reduce the distortion component on the basis of the fed-back distortion component signal (the entire distortion component).

By employing any one of the configuration of the amplifier with a pre-distorter shown in FIG. 1 and the configuration of the amplifier with a pre-distorter shown in FIG. 10, it is possible to extract a distortion-component signal by the use of the filter 8 disposed on the feedback side and to perform control so as to reduce the distortion component.

Accordingly, the amplifier with a pre-distorter shown in FIG. 1 is used in the first to third embodiments, but the amplifier with a pre-distorter shown in FIG. 10 may be used instead, that is, the signal obtained by suppressing the desired signal band by the use of the filter (the BPF in this embodiment) may be used to calculate the orthogonalization coefficients $\phi_{ij}$ in the amplifier with a pre-distorter shown in FIG. 10.

[Hereinafter, Functional Means or Terms in the Embodiments are Described]

In the amplifier with a pre-distorter (an example of the distortion compensation amplification device) shown in FIG. 1 or 10, the level detecting means is constructed by the function of the amplitude detector 11, the correspondence storage means is constructed by the function of the distortion compensation table (LUT) 12, the pre-distortion executing means is constructed by the function of the pre-distortion execution unit 13, the filtering means is constructed by the function of the filter 8, the correspondence acquiring means is constructed by the function of the controller (learning) 14, and the input signal function value acquiring means is constructed by the function of the $\Phi_3$ acquisition unit 15 or the $\Phi_5$ acquisition unit 17.

In this embodiment, the function of giving the inverse characteristic of the non-linear characteristic of the amplifier has the format of $p(t)=B_2\Phi_2(x(t))+A_3\Phi_3(x(t))+B_4\Phi_4(x(t))+A_5\Phi_5(x(t))+B_6\Phi_6(x(t))+A_7\Phi_7(x(t))+ \ldots$ (where only one of $A_i$ and $B_i$ may be provided). The pre-distortion learning coefficients are $A_i$ and $B_i$ and the distortion compensation coefficient for executing the pre-distortion has the format of $p'(t)=\beta_2\{|x(t)|^2-|x(t-U)|^2\}+\alpha_3|x(t)|^2+\beta_4\{|x(t)|^4-|x(t-U)|^4\}+\alpha_5|x(t)|^4+\beta_6\{|x(t)|^6-|x(t-U)|^6\}+\alpha_7|x(t)|^6+ \ldots$ (where only one of $\alpha_i$ and $\beta_i$ may be provided). The correspondence between the distortion compensation coefficient for executing the pre-distortion and the level of the signal input to the pre-distorter is the table contents recorded in the distortion compensation table (LUT) 12. The set of orthogonal polynomials is a group of $\Phi_1, \Phi_2, \Phi_3, \Phi_4, \Phi_5, \ldots$, and the orthogonal functions are the functions of $\Phi_1, \Phi_2, \Phi_3, \Phi_4, \Phi_5, \ldots$. The parameter (for orthogonalization) is the orthogonalization coefficient $\phi$, and more specifically, is $\phi_{33}, \phi_{53}, \phi_{55}, \phi_{73}, \ldots$. The functions of input signals are $|x(t)|^2 x(t), |x(t)|^4 x(t), |x(t)|^6 x(t), \ldots$. The functions obtained by applying a filter are $BPF[|x(t)|^2 x(t)], BPF[|x(t)|^4 x(t)], \ldots$. The signals corresponding to one or more orthogonal functions are $|x(t)|^2 x(t), |x(t)|^4 x(t), |x(t)|^6 x(t), \ldots$.

[Hitherto, Functional Means or Terms in the Embodiments are Described]

[Hereinafter, the Configuration of the Distortion Compensation Amplification Device Understood from the Embodiments is Described]

The configurations of the distortion compensation amplification device understood from the above-mentioned embodiments will be described.

The distortion compensation amplification device according to a first configuration has a pre-distorter that generates and outputs a signal with an inverse characteristic of a non-linear characteristic to an amplifier so as to compensate for distortion resulting from the non-linear characteristic of the amplifier, and includes: level detecting means for detecting a level of a signal input to the pre-distorter; correspondence storage means for storing a correspondence between a distortion compensation coefficient for executing pre-distortion and the level of the signal input to the pre-distorter; predistortion executing means for giving the inverse characteristic of the non-linear characteristic of the amplifier to the signal input to the pre-distorter in accordance with the distortion compensation coefficient for executing the pre-distortion and outputting the resultant signal to the amplifier; filtering means for removing a frequency component of desired-waves from a feedback signal output from the amplifier and outputting a distortion component; and correspondence acquiring means for updating a pre-distortion learning coefficient constituting a function of giving the inverse characteristic of the non-linear characteristic of the amplifier to the signal input to the pre-distorter so as to reduce the distortion component acquired by the filtering means, acquiring the correspondence between the distortion compensation coefficient for executing the pre-distortion and the level of the signal input to the pre-distorter in accordance with the updated pre-distortion learning coefficient, and outputting the acquired correspondence to the correspondence storage means, wherein the function of giving the inverse characteristic of the non-linear characteristic of the amplifier is expressed using a set of orthogonal polynomials, each orthogonal functions of the set of orthogonal polynomials is the total sum of products of one or more functions of the input signal and parameters corresponding to each of the functions of the input signal, and the parameters corresponding to one or more functions of the input signal are set to cause the orthogonal functions to be orthogonal to each other when functions, which are acquired by applying a filter with the same filter characteristic as that of the filtering means to the functions of the input signal, are replaced for the functions of the input signal of the orthogonal functions.

A second configuration is the distortion compensation amplification device according to the first configuration further including function signal acquiring means for acquiring signals from the functions of the input signal of the orthogonal functions corresponding to the signal input to the pre-distorter, wherein the correspondence acquiring means extracts signal components corresponding to one or more orthogonal functions from the distortion component by complex-multiplying the distortion component acquired by the filtering means by the signals acquired by the function signal acquiring means respectively, and updates the pre-distortion learning coefficient so as to reduce the respective extracted signal components.

A third configuration is the distortion compensation amplification device according to the first configuration further including: function signal acquiring means for acquiring signals from the functions of the input signal of the orthogonal functions corresponding to the signal input to the pre-distorter; and function signal filtering means for acquiring signals by applying a filter having the same filter characteristic as that of the filtering means to the signals acquired by the function signal acquiring means, wherein the correspondence acquiring means extracts signal components corresponding to one or more orthogonal functions from the distortion component by complex-multiplying the distortion component acquired by the filtering means by the signals acquired by the function signal filtering means respectively, and updates the pre-distortion learning coefficient so as to reduce the respective extracted signal components.

The third configuration is the second configuration wherein a filter is disposed on the input signal side ($\Phi$).

A fourth configuration is the distortion compensation amplification device according to the first configuration, wherein the correspondence acquiring means updates the pre-distortion learning coefficient so as to reduce the whole of the distortion component acquired by the filtering means.

The correspondence between the above-mentioned embodiments and the first to fourth configurations will be described below.

In the first to fourth configurations, the level detecting means is constructed by the function of the amplitude detector 11, the correspondence storage means is constructed by the function of the distortion compensation table (LUT) 12, the pre-distortion executing means is constructed by the function of the pre-distortion execution unit 13, the filtering means is constructed by the function of the filter 8, the correspondence acquiring means is constructed by the function of the controller (learning) 14, the function signal acquiring means (means corresponding to the input signal function value acquiring means) is constructed by the function of the $\Phi_3$ acquisition unit 15 or the $\Phi_5$ acquisition unit 17, and the function signal filtering means is constructed by the function of the filter 16 or the filter 18.

In the first to fourth configurations, the function of giving the inverse characteristic of the non-linear characteristic of the amplifier has the format of $p(t)=B_2\Phi_2(x(t))+A_3\Phi_3(x(t))+B_4\Phi_4(x(t))+A_5\Phi_5(x(t))+B_6\Phi_6(x(t))+A_7\Phi_7(x(t))+\ldots$ (where only one of $A_i$ and $B_i$ may be provided). The pre-distortion learning coefficients are $A_i$ and $B_i$ and the distortion compensation coefficient for executing the pre-distortion has the format of $p'(t)=\beta_2\{|x(t)|^2-|x(t-U)|^2\}+\alpha_3|x(t)|^2+\beta_4\{|x(t)|^4-|x(t-U)|^4\}+\alpha_5|x(t)|^4+\beta_6\{|x(t)|^6-|x(t-U)|^6\}+\alpha_7|x(t)|^6+\ldots$ (where only one of $\alpha_i$ and $\beta_i$ may be provided). The correspondence between the distortion compensation coefficient for executing the pre-distortion and the level of the signal input to the pre-distorter is the table contents recorded in the distortion compensation table (LUT) 12. The set of orthogonal polynomials is a group of $\Phi_1, \Phi_2, \Phi_3, \Phi_4, \Phi_5, \ldots$, and the orthogonal functions are the functions of $\Phi_1, \Phi_2, \Phi_3, \Phi_4, \Phi_5, \ldots$. The parameter (for orthogonalization) is the orthogonalization coefficient $\phi$, and more specifically, is $\phi_{33}, \phi_{53}, \phi_{55}, \phi_{273}, \ldots$. The functions of the input signal are $|x(t)|^2 x(t), |x(t)|^4 x(t), |x(t)|^6 x(t), \ldots$. The functions obtained by applying a filter are $BPF[|x(t)|^2 x(t)], BPF[|x(t)|^4 x(t)], \ldots$. The signals corresponding to one or more orthogonal functions are $|x(t)|^2 x(t), |x(t)|^4 x(t), |x(t)|^6 x(t), \ldots$.

[Hitherto, the Configuration of the Distortion Compensation Amplification Device Understood from the Embodiments is Described]

The system or device according to the invention is not limited to the above-mentioned configurations, but may have other configurations. The invention may be provided as a method or procedure of performing the processes associated with the invention, a program for embodying the method or procedure, or a recording medium having recorded thereon the program, or may be provided as various systems or devices.

The field of the invention is not limited to the above-mentioned field, but the invention may be applied to various fields.

The processes performed in the system or device according to the invention may be controlled by causing a processor in hardware resources including the processor or memory to execute a control program stored in a ROM (Read Only Memory), or for example, the functional means for performing the processes may be embodied as independent hardware circuits, respectively.

The invention may be understood as a computer-readable recording medium such as a Floppy (registered trademark) disk or a CD (Compact Disc)-ROM having the control program stored therein or as the program (itself), the processes associated with the invention may be carried out by inputting the control program to the computer from the recording medium and causing a processor to execute the program.

REFERENCE SIGNS LIST

1: PRE-DISTORTER
2: D/A CONVERTER
3: UP CONVERTER
4: POWER AMPLIFICATION UNIT
5: DIRECTIONAL COUPLER
6: DOWN CONVERTER
7: A/D CONVERTER
8, 16, 18: FILTER
9: ANTENNA
11: AMPLITUDE DETECTOR
12: DISTORTION COMPENSATION TABLE
13: PRE-DISTORTION EXECUTION UNIT
14, 14a, 14b, 101: CONTROLLER
15: $\Phi_3$ acquisition unit
17: $\Phi_5$ acquisition unit
21, 41: SECOND POWER DETECTOR
22, 25, 44, 49: MULTIPLIER
23, 26, 31, 45, 50: COMPLEX MULTIPLIER
24, 46: FOURTH POWER DETECTOR
27, 51, 63, 64: ADDER
32: COMPLEX ADDER
42, 47: DELAY CIRCUIT
43, 48, 111: SUBTRACTOR (REVERSED-PHASE ADDER)
61: MEMORYLESS PRE-DISTORTER
62: MEMORY-EFFECT PRE-DISTORTER
71, 91: BAND-PASS FILTER
81, 92, 112: ADAPTIVE ALGORITHM UNIT

The invention claimed is:

1. A distortion compensation amplification device having a pre-distorter that generates and outputs a signal with an inverse characteristic of a non-linear characteristic to an amplifier so as to compensate for distortion resulting from the non-linear characteristic of the amplifier, the distortion compensation amplification device comprising:
a level detecting means for detecting a level of a signal input to the pre-distorter;
a correspondence storage means for storing a correspondence between a distortion compensation coefficient for executing pre-distortion and the level of the signal input to the pre-distorter;
a pre-distortion executing means for giving the inverse characteristic of the non-linear characteristic of the amplifier to the signal input to the pre-distorter in accordance with the distortion compensation coefficient for executing the pre-distortion and outputting the resultant signal to the amplifier;
a filtering means for removing a frequency component of desired-waves from a feedback signal output from the amplifier and outputting a distortion component; and
a correspondence acquiring means for updating a pre-distortion learning coefficient constituting a function of giving the inverse characteristic of the non-linear characteristic of the amplifier to the signal input to the pre-distorter so as to reduce the distortion component acquired by the filtering means, acquiring the correspondence between the distortion compensation coefficient for executing the pre-distortion and the level of the signal input to the pre-distorter in accordance with the updated pre-distortion learning coefficient, and outputting the acquired correspondence to the correspondence storage means, wherein the function of giving the inverse characteristic of the non-linear characteristic of the amplifier is expressed using a set of orthogonal polynomials,
each orthogonal function of the set of orthogonal polynomials is the total sum of products of one or more functions of the input signal and parameters corresponding to each of the functions of the input signal, and
the parameters corresponding to the one or more functions of the input signal are set to cause the orthogonal functions to be orthogonal to each other when functions, which are acquired by applying a filter with the same filter characteristic as that of the filtering means to the functions of the input signal, are replaced for the functions of the input signal of the orthogonal functions.

2. The distortion compensation amplification device according to claim 1, further comprising a function signal acquiring means for acquiring signals from the functions of the input signal of the orthogonal functions corresponding to the signal input to the pre-distorter,
wherein the correspondence acquiring means extracts signal components corresponding to the one or more orthogonal functions from the distortion component by complex-multiplying the distortion component acquired by the filtering means by the signals acquired by the function signal acquiring means respectively, and updates the pre-distortion learning coefficient so as to reduce the respective extracted signal components.

3. The distortion compensation amplification device according to claim 1, further comprising:
a function signal acquiring means for acquiring signals from the functions of the input signal of the orthogonal functions corresponding to the signal input to the pre-distorter; and
a function signal filtering means for acquiring signals by applying a filter having the same filter characteristic as that of the filtering means to the signals acquired by the function signal acquiring means,
wherein the correspondence acquiring means extracts signal components corresponding to the one or more orthogonal functions from the distortion component by complex-multiplying the distortion component acquired by the filtering means by the signals acquired by the function signal filtering means respectively, and updates the pre-distortion learning coefficient so as to reduce the respective extracted signal components.

4. The distortion compensation amplification device according to claim 1, wherein the correspondence acquiring means updates the pre-distortion learning coefficient so as to reduce the whole of the distortion component acquired by the filtering means.

* * * * *